(12) United States Patent
Wang

(10) Patent No.: US 8,980,647 B2
(45) Date of Patent: Mar. 17, 2015

(54) METHOD OF MANUFACTURING SEMICONDUCTOR DEVICE

(71) Applicant: Fujitsu Semiconductor Limited, Yokohama, Kanagawa (JP)

(72) Inventor: Wensheng Wang, Kuwana (JP)

(73) Assignee: Fujitsu Semiconductor Limited, Yokohama (JP)

( * ) Notice: Subject to any disclaimer, the term of this patent is extended or adjusted under 35 U.S.C. 154(b) by 285 days.

(21) Appl. No.: 13/654,751

(22) Filed: Oct. 18, 2012

(65) Prior Publication Data

US 2013/0149794 A1 Jun. 13, 2013

(30) Foreign Application Priority Data

Dec. 7, 2011 (JP) ................................. 2011-268359

(51) Int. Cl.
  *H01L 21/00* (2006.01)
  *H01L 27/115* (2006.01)
  *H01L 49/02* (2006.01)
(52) U.S. Cl.
  CPC .......... *H01L 27/11507* (2013.01); *H01L 28/56* (2013.01); *H01L 28/65* (2013.01); *H01L 28/75* (2013.01)
  USPC .. 438/3; 257/295; 257/E21.664; 257/E27.104
(58) Field of Classification Search
  CPC .............. H01L 27/11507; H01L 28/57; H01L 21/31691; G11C 11/221
  USPC ................ 438/3; 257/295, E21.664, E27.104
  See application file for complete search history.

(56) References Cited

U.S. PATENT DOCUMENTS

| 5,807,774 | A | 9/1998 | Desu et al. |
| 2003/0232479 | A1* | 12/2003 | Kondo et al. ................. 438/328 |
| 2004/0113189 | A1* | 6/2004 | Takamatsu et al. ........... 257/295 |
| 2004/0229384 | A1* | 11/2004 | Kijima et al. ..................... 438/3 |
| 2005/0136556 | A1* | 6/2005 | Matsuura et al. ................. 438/3 |
| 2005/0161716 | A1* | 7/2005 | Matsuura et al. ............. 257/295 |

(Continued)

FOREIGN PATENT DOCUMENTS

| JP | 10-173142 A | 6/1998 |
| JP | 2006-302975 A | 11/2006 |

(Continued)

OTHER PUBLICATIONS

Chinese Office Action dated Aug. 21, 2014, issued in corresponding CN application No. 201210428275.6 with English translation (13 pages).

*Primary Examiner* — Steven J Fulk
(74) *Attorney, Agent, or Firm* — Westerman, Hattori, Daniels & Adrian, LLP

(57) ABSTRACT

A method of manufacturing a semiconductor device includes: forming a conductive film over a semiconductor substrate; forming a first ferroelectric film over the conductive film; forming an amorphous second ferroelectric film over the first ferroelectric film; forming a transition metal oxide material film containing ruthenium over the second ferroelectric film; forming a first conductive metal oxide film over the transition metal oxide material film without exposing the transition metal oxide material film to the air; annealing and crystallizing the second ferroelectric film; and patterning the first conductive metal oxide film, the first ferroelectric film, the second ferroelectric film, and the conductive film to form a ferroelectric capacitor.

14 Claims, 40 Drawing Sheets

(56) References Cited

U.S. PATENT DOCUMENTS

| | | |
|---|---|---|
| 2006/0231880 A1 | 10/2006 | Yamakawa et al. |
| 2007/0228431 A1 | 10/2007 | Wang |
| 2008/0111172 A1* | 5/2008 | Wang et al. ............ 257/295 |
| 2008/0258193 A1 | 10/2008 | Yamakawa et al. |
| 2009/0091876 A1 | 4/2009 | Yamakawa et al. |
| 2009/0309188 A1* | 12/2009 | Wang ............ 257/532 |
| 2009/0315144 A1* | 12/2009 | Wang ............ 257/532 |
| 2010/0330769 A1 | 12/2010 | Yamakawa et al. |
| 2011/0101432 A1* | 5/2011 | Wang ............ 257/295 |
| 2012/0032299 A1* | 2/2012 | Wang ............ 257/532 |
| 2012/0181659 A1* | 7/2012 | Wang ............ 257/532 |
| 2013/0026603 A1* | 1/2013 | Wang ............ 257/532 |

FOREIGN PATENT DOCUMENTS

| | | |
|---|---|---|
| JP | 2008-270596 A | 11/2008 |
| JP | 2009-094200 A | 4/2009 |

* cited by examiner

US 8,980,647 B2

METHOD OF MANUFACTURING SEMICONDUCTOR DEVICE

CROSS-REFERENCE TO RELATED APPLICATION

This application is based upon and claims the benefit of priority of the prior Japanese Patent Application No. 2011-268359, filed on Dec. 7, 2011, the entire contents of which are incorporated herein by reference.

FIELD

The embodiments discussed herein are related to a method of manufacturing a semiconductor device.

BACKGROUND

Among various nonvolatile memories which hold data even after being powered off, a ferroelectric random access memory (FeRAM) including a ferroelectric capacitor writes data at high speed and may operate at a low voltage.

A ferroelectric capacitor includes a capacitor dielectric film made of a ferroelectric substance. When a voltage is applied between a bottom electrode and a top electrode, a polarization occurs in the capacitor dielectric film, and data is stored with the polarization direction of the capacitor dielectric film set to "0" or "1."

Although ferroelectric capacitors of various structures have been proposed to improve characteristics of the FeRAM, they still have room for improvement.

For example, there have been proposed a method for forming a Lead Zirconium Titanate (PZT) film as a capacitor dielectric film, and then forming a top electrode containing $RuO_2$ on the PZT film. However, in this method, ruthenium in the top electrode diffuses into the PZT film. As a result, a paraelectric layer in which the ferroelectric substance has changed into a paraelectric substance is formed in the PZT film near an interface between the PZT film and the top electrode. This reduces the thickness of the portion of the PZT film having a ferroelectric characteristic.

Moreover, the presence of the paraelectric layer causes a problem that a voltage applied to the ferroelectric capacitor is not applied efficiently to the PZT film due to the absorption of the voltage by the paraelectric layer.

Meanwhile, there has also been proposed a method in which a PZT film is formed as a capacitor dielectric film, an SRO ($SrRuO_3$) film is formed thereon, and then a top electrode is formed on the SRO film. According to this method, the oxygen deficiency in the interface between the PZT film and the top electrode is offset by the SRO film.

However, since the SRO film is highly hygroscopic and absorbs moist in the air, the moist may reduce the PZT film and cause deterioration in the ferroelectric characteristic of the PZT film. Particularly in this method, the substrate is exposed to the air for a period after the formation of the SRO film until the formation of the top electrode, whereby a severe deterioration occurs in the PZT film due to the moisture absorption of the SRO film.

[Patent Literature 1] Japanese Laid-open Patent Publication No. 10-173142
[Patent Literature 2] Japanese Laid-open Patent Publication No. 2008-270596
[Patent Literature 3] Japanese Laid-open Patent Publication No. 2006-302975
[Patent Literature 4] Japanese Laid-open Patent Publication No. 2009-94200

SUMMARY

According to an aspect of the disclosure, a method of manufacturing a semiconductor device includes: forming an insulating film over a semiconductor substrate; forming a conductive film over the insulating film; forming a first ferroelectric film over the conductive film; forming an amorphous second ferroelectric film over the first ferroelectric film; forming a transition metal oxide material film containing ruthenium over the second ferroelectric film; forming a first conductive metal oxide film over the transition metal oxide material film without exposing the transition metal oxide material film to an air; annealing and crystallizing the second ferroelectric film after forming the first conductive metal oxide film; patterning the first conductive metal oxide film to form a top electrode of a ferroelectric capacitor; patterning the first ferroelectric film and the second ferroelectric film to form a capacitor dielectric film of the ferroelectric capacitor; and patterning the conductive film to form a bottom electrode of the ferroelectric capacitor.

Moreover, according to another aspect of the disclosure, a method of manufacturing a semiconductor device includes: forming an insulating film over a semiconductor substrate; forming a conductive film over the insulating film; forming a first ferroelectric film over the conductive film; forming an amorphous second ferroelectric film containing iridium and ruthenium over the first ferroelectric film; forming a first conductive metal oxide film over the second ferroelectric film; annealing and crystallizing the second ferroelectric film after forming the first conductive metal oxide film; patterning the first conductive metal oxide film to form a top electrode of a ferroelectric capacitor; patterning the first ferroelectric film and the second ferroelectric film to form a capacitor dielectric film of the ferroelectric capacitor; and patterning the conductive film to form a bottom electrode of the ferroelectric capacitor.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Prior to the description of embodiments, a description is given of preliminary matters serving as a basis.

When materials of a top electrode diffuse into a capacitor dielectric film of a ferroelectric capacitor, a paraelectric layer which does not contribute to a ferroelectric characteristic of the capacitor dielectric film is formed. Hereinafter, a description is given of a ferroelectric capacitor in which such a paraelectric substance is formed.

Figure 1:
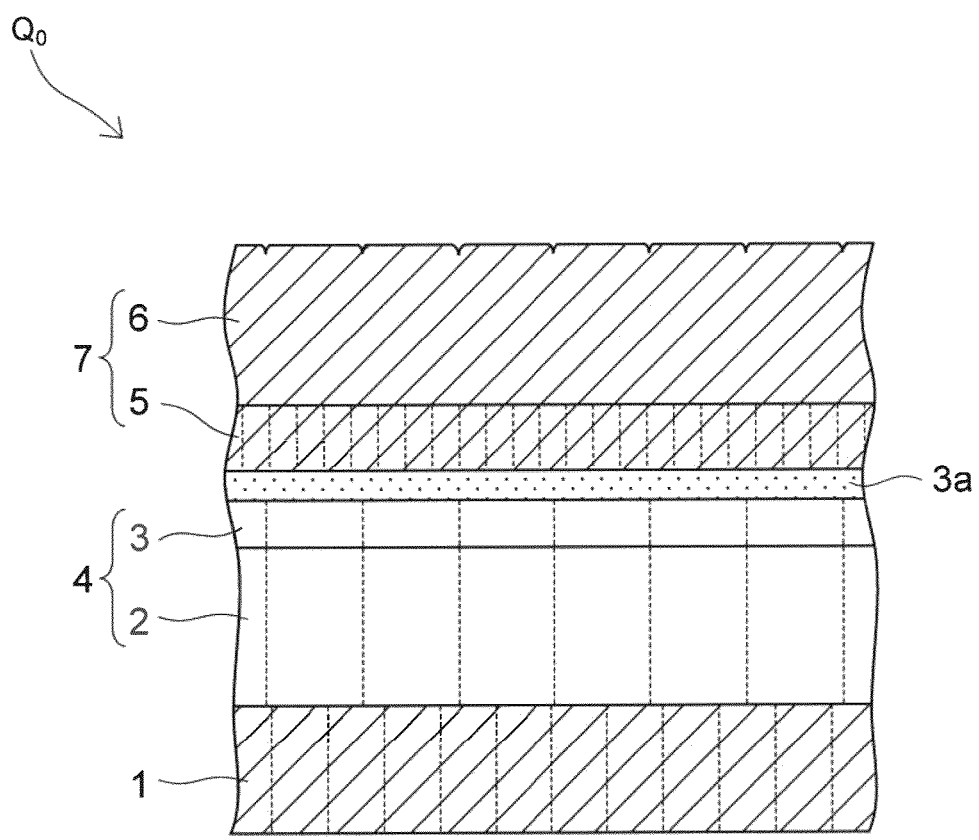
FIG. 1 illustrates in an enlarged cross section a ferroelectric capacitor.

FIG. 1 illustrates the ferroelectric capacitor in an enlarged cross section.

The ferroelectric capacitor $Q_0$ includes a bottom electrode 1, a capacitor dielectric film 4, and a top electrode 7.

Among these, a platinum film oriented in a (111) direction may be formed as the bottom electrode 1, for example.

In addition, the capacitor dielectric film 4 includes a first ferroelectric film 2 and a second ferroelectric film 3 formed in this order, both films being made of PZT.

The top electrode 7 includes a first conductive metal oxide film 5 made of an iridium oxide, and a second conductive metal oxide film 6 made of an iridium oxide having a larger composition ratio of oxygen than the first conductive metal oxide film 5, formed in this order.

Note that the broken lines in FIG. 1 schematically depict crystal grains in the films.

To manufacture the ferroelectric capacitor $Q_0$, an amorphous second ferroelectric film 3 is formed, the first conductive metal oxide film 5 is formed thereon, and the second ferroelectric film 3 is annealed through the first conductive metal oxide film 5 in an oxygen-containing atmosphere.

Thus, the second ferroelectric film 3 crystallizes by heat from the annealing, and is provided with oxygen through the first conductive metal oxide film 5 to offset its oxygen deficiency.

Moreover, by forming the first conductive metal oxide film 5 on the amorphous and even second ferroelectric film 3, most of the iridium diffused from the first conductive metal oxide film 5 is absorbed by the second ferroelectric film 3. Accordingly, it may be possible to prevent iridium from diffusing into grain boundaries of the first ferroelectric film 2, so that leak paths due to the iridium are not generated in the capacitor dielectric film 4.

Hence, the two-layered capacitor dielectric film 4 is advantageous in suppressing leakage currents in the ferroelectric capacitor $Q_o$.

However, in a portion of the second ferroelectric film 3 into which a large amount of iridium of the top electrode 7 has diffused, the ferroelectric substance changes into a paraelectric substance to form a paraelectric layer 3a. The paraelectric layer 3a is also called a dead layer, and does not contribute to the ferroelectric characteristic of the capacitor dielectric film 4. In fact, the paraelectric layer 3a thins the portion of the capacitor dielectric film 4 having the ferroelectric characteristic, which lowers the ferroelectric characteristic such as the amount of charge reversal in the ferroelectric capacitor $Q_o$.

FeRAMs have been operated at lower voltages in recent years. However, to prevent lowering in the electric field strength to be applied to the capacitor dielectric film 4 by the bottom electrode 1 and the top electrode 7 even with the low operating voltage, it is advantageous to form a thin capacitor dielectric film 4. However, thinning of the capacitor dielectric film 4 enlarges the rate of the paraelectric layer 3a in the capacitor dielectric film 4, and thus the deterioration in the ferroelectric characteristic of the ferroelectric capacitor $Q_0$ becomes even more severe.

Hereinbelow, a description is given of a method of manufacturing a semiconductor device, in which formation of such a paraelectric layer may be suppressed.

First Embodiment

Figure 2A:
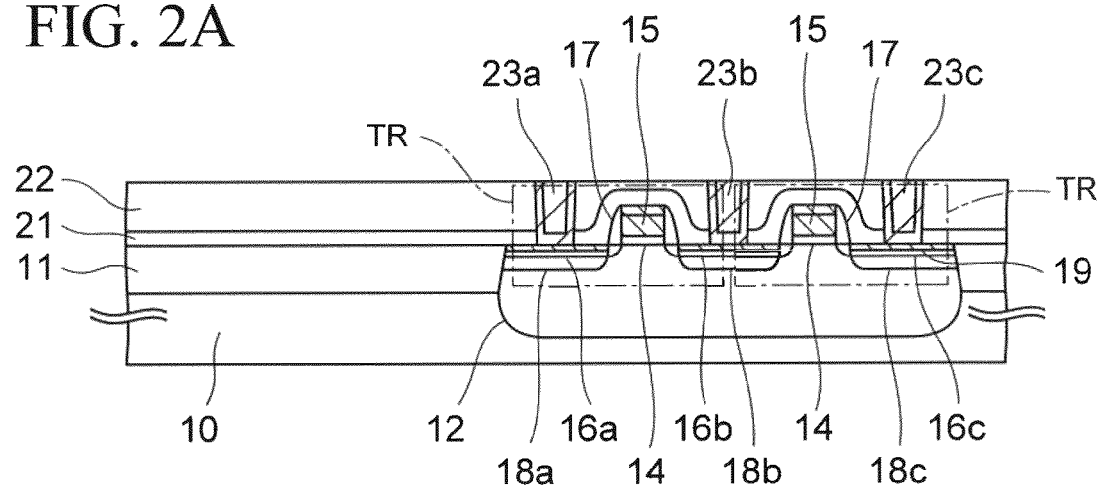
FIGS. 2A to 2W illustrate in sectional views a semiconductor device according to a first embodiment in the course of manufacturing.
Figure 2B:
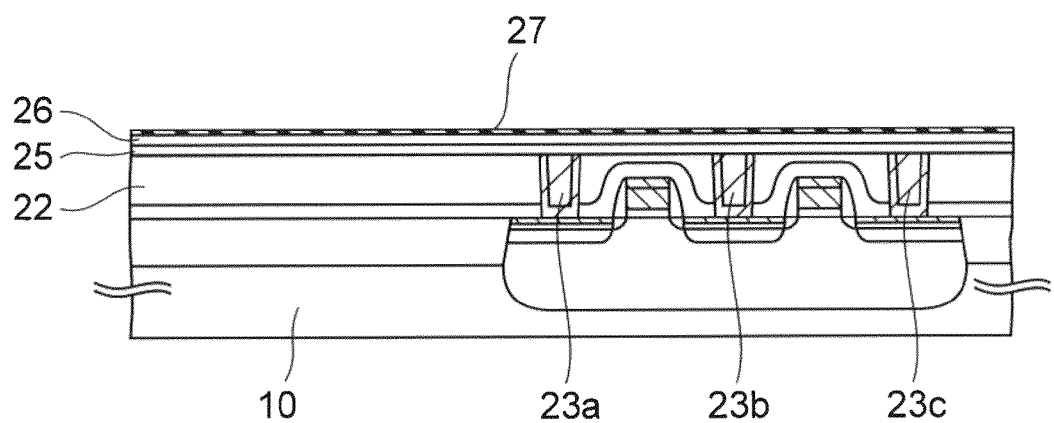
Figure 2C:
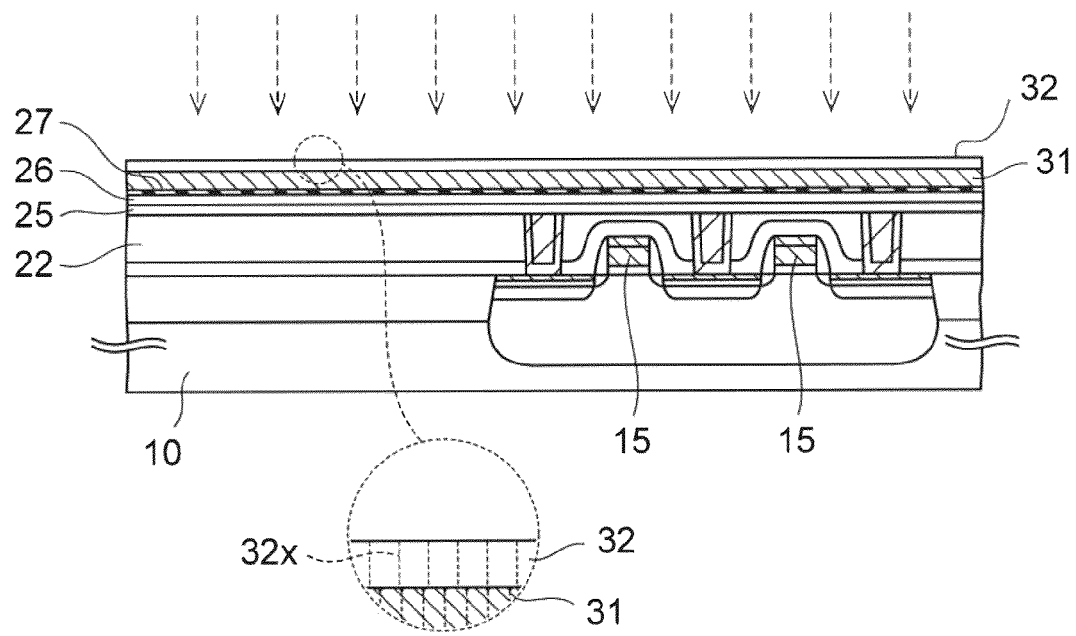
Figure 2D:
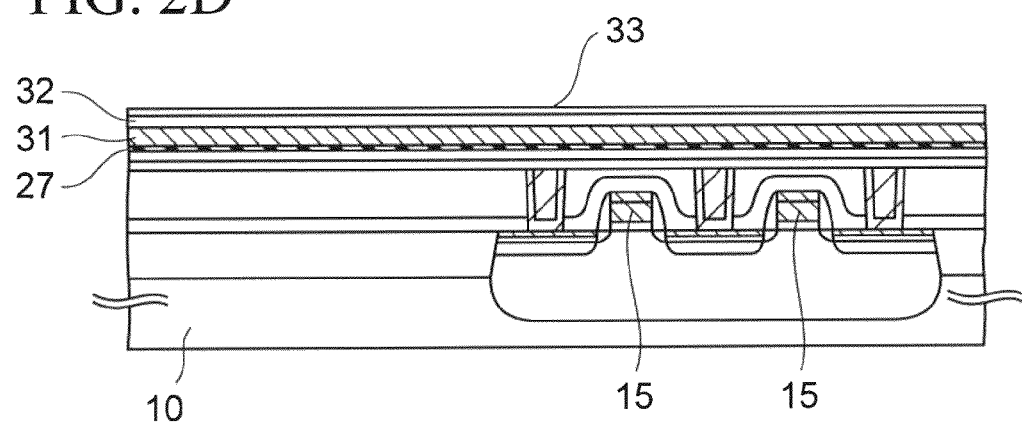
Figure 2E:
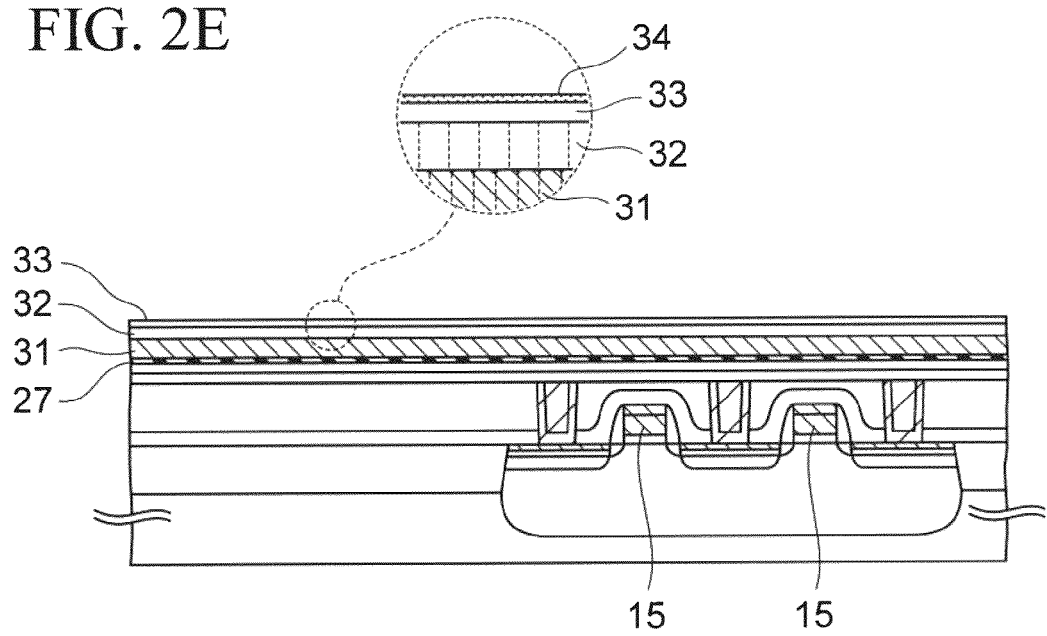
Figure 2F:
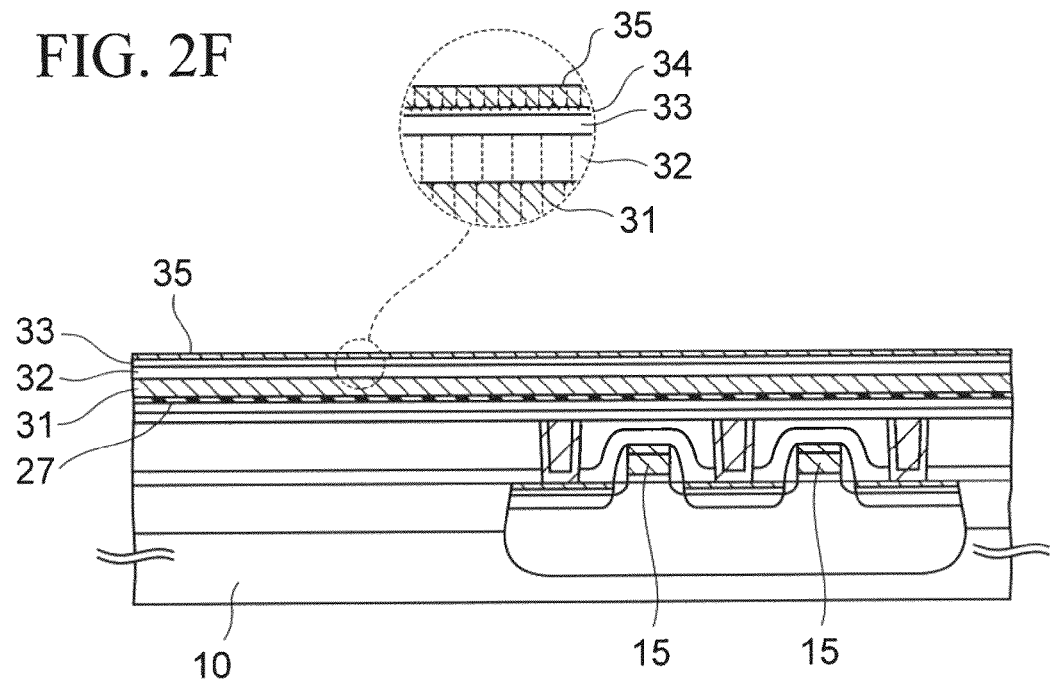
Figure 2G:
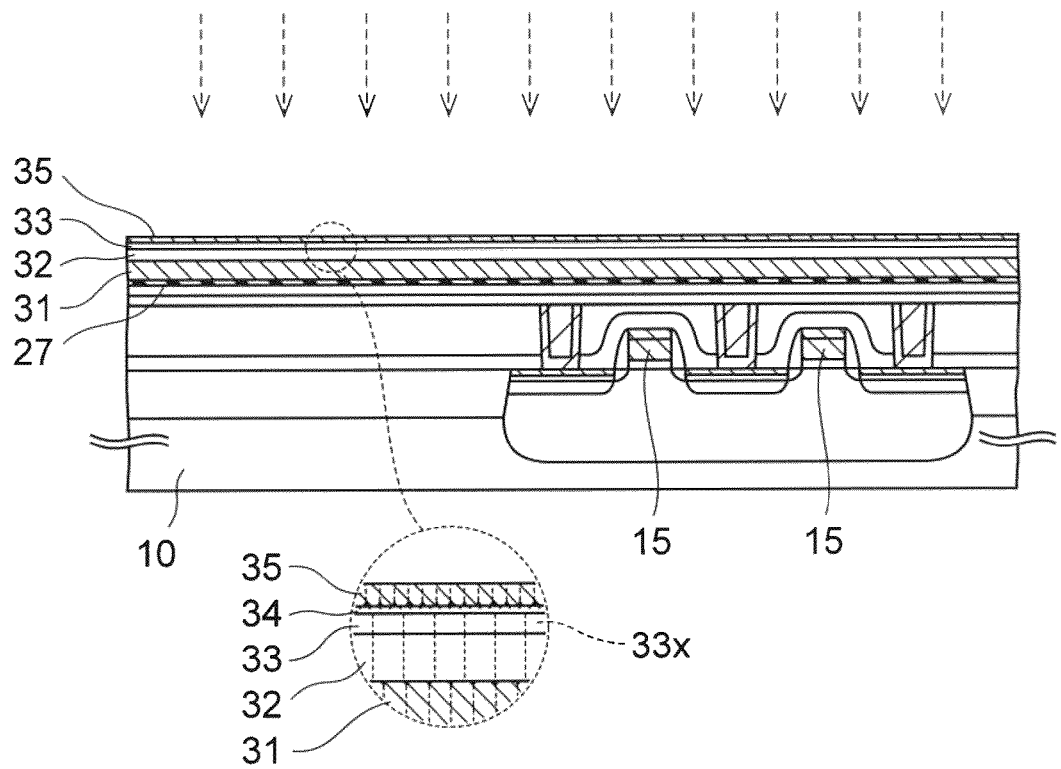
Figure 2H:
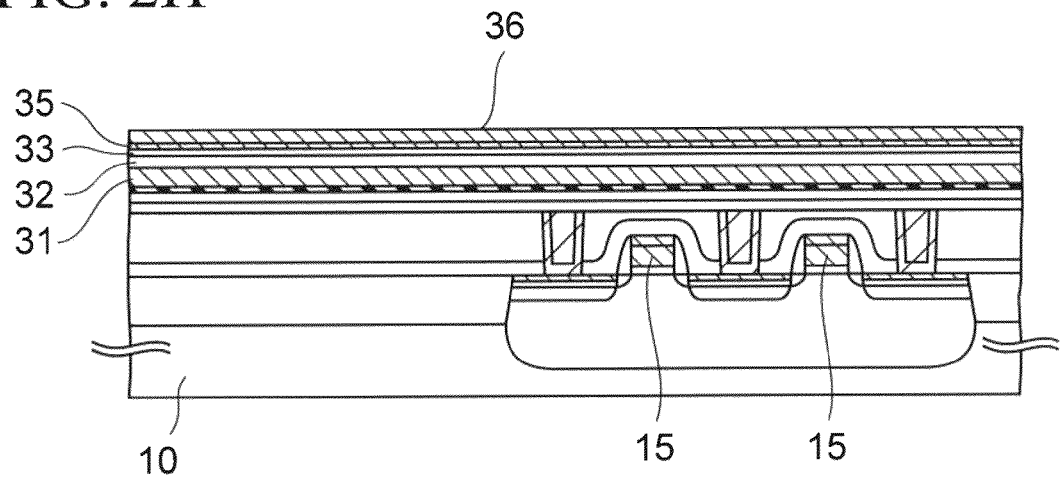
Figure 2I:
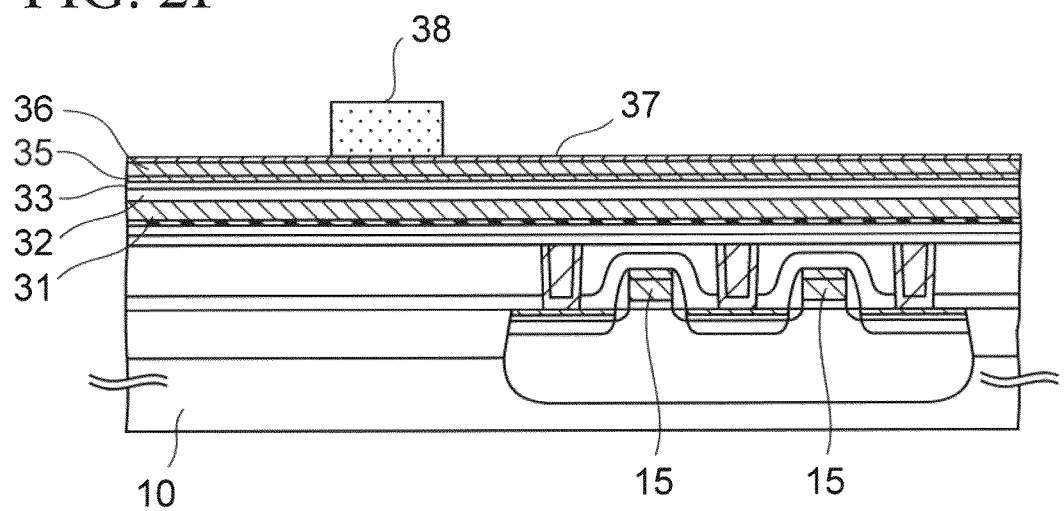
Figure 2J:
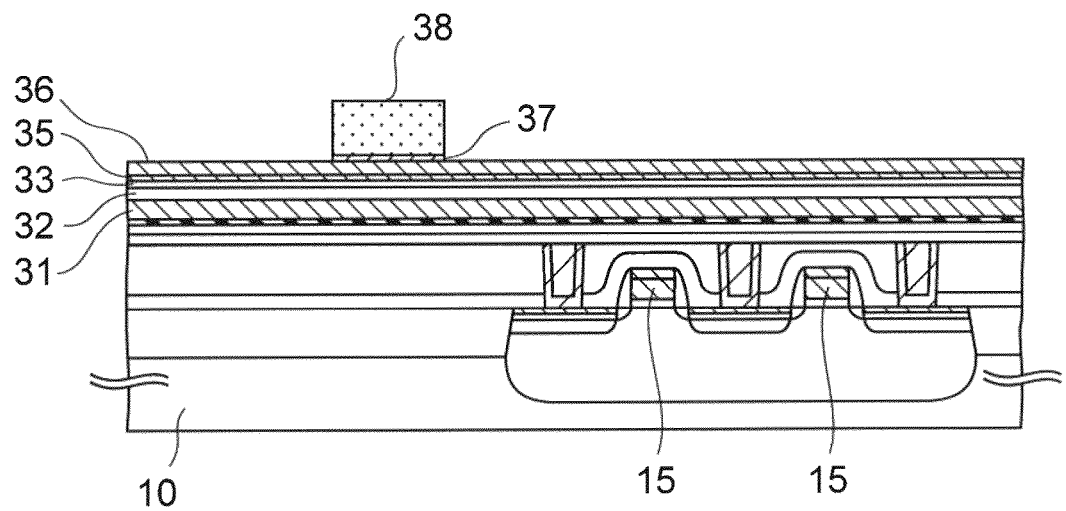
Figure 2K:
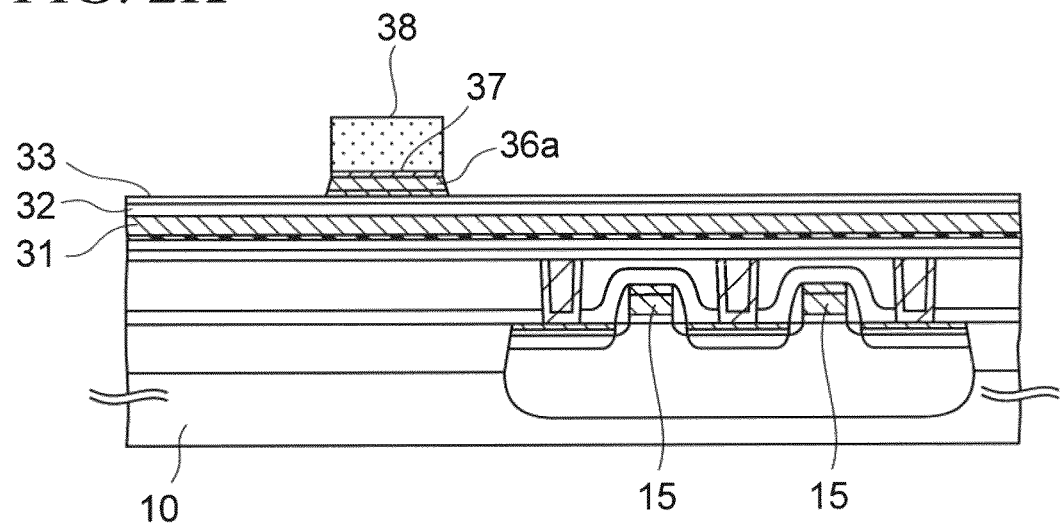
Figure 2L:
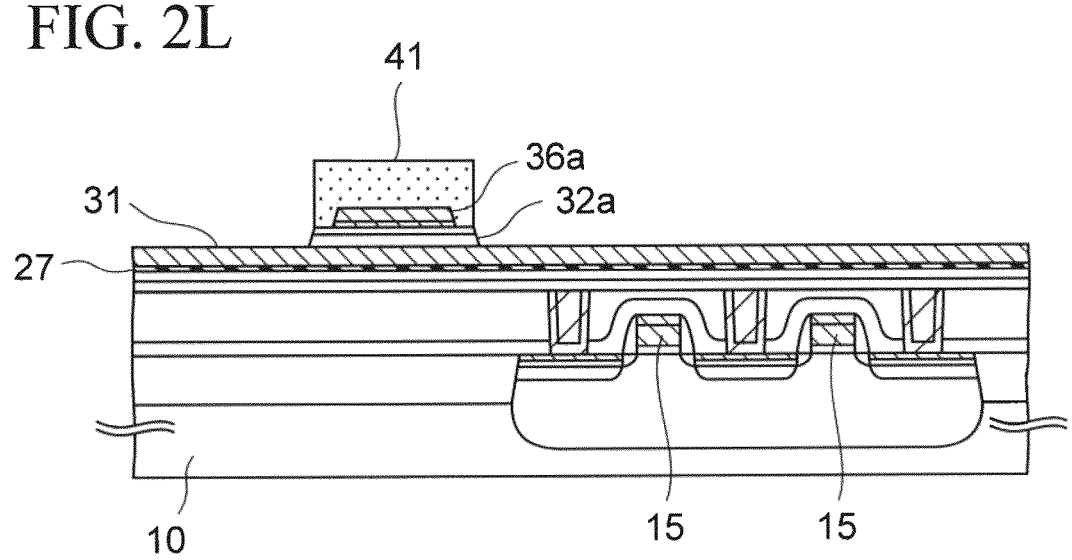
Figure 2M:
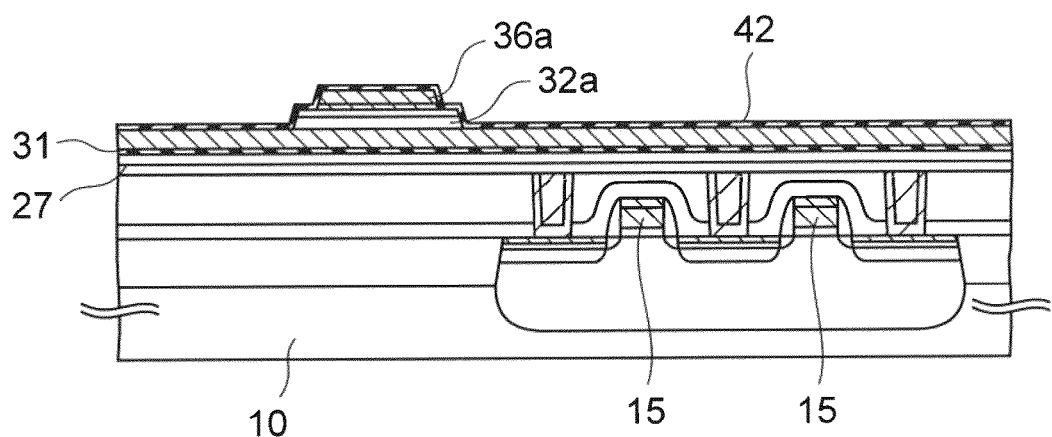
Figure 2N:
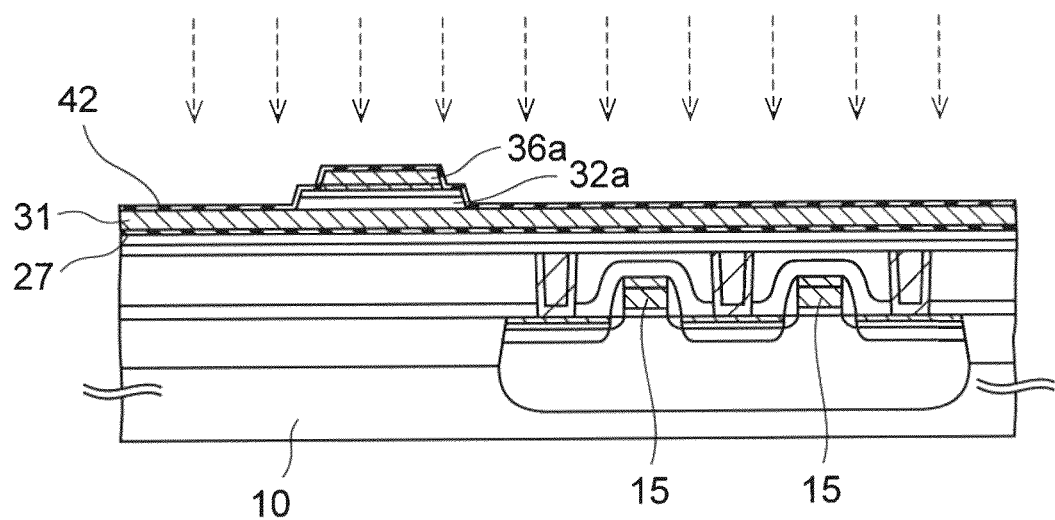
Figure 2O:
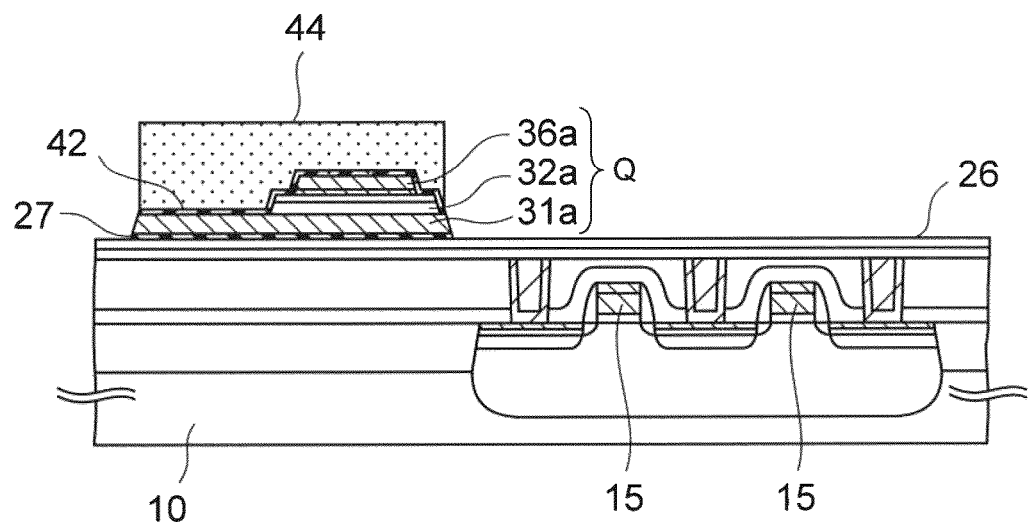
Figure 2P:
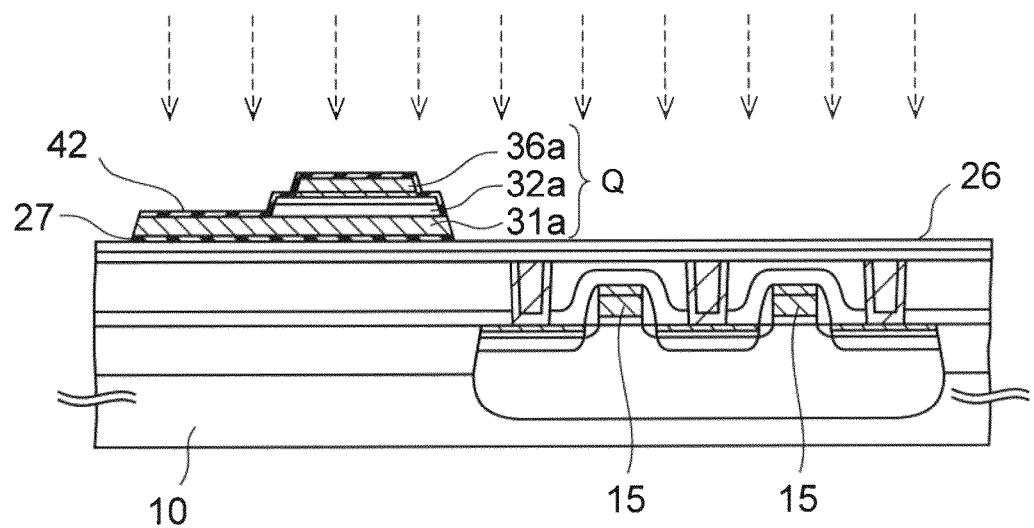
Figure 2Q:
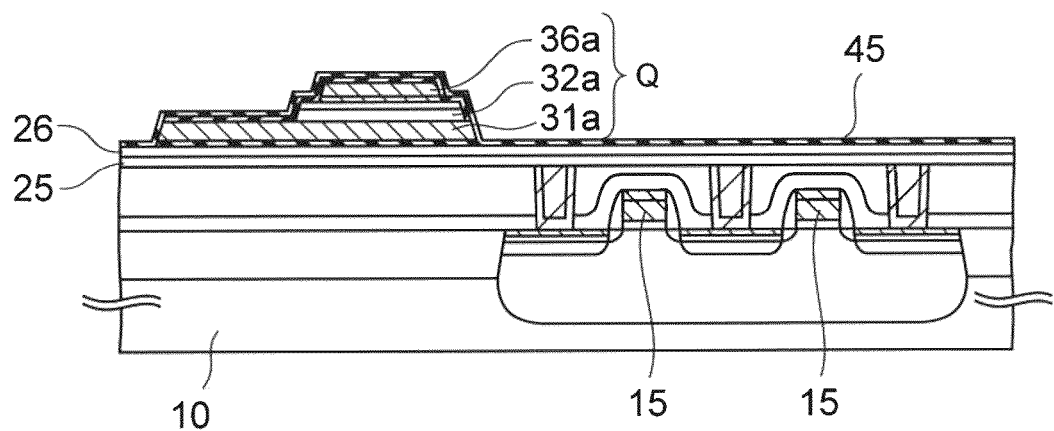
Figure 2R:
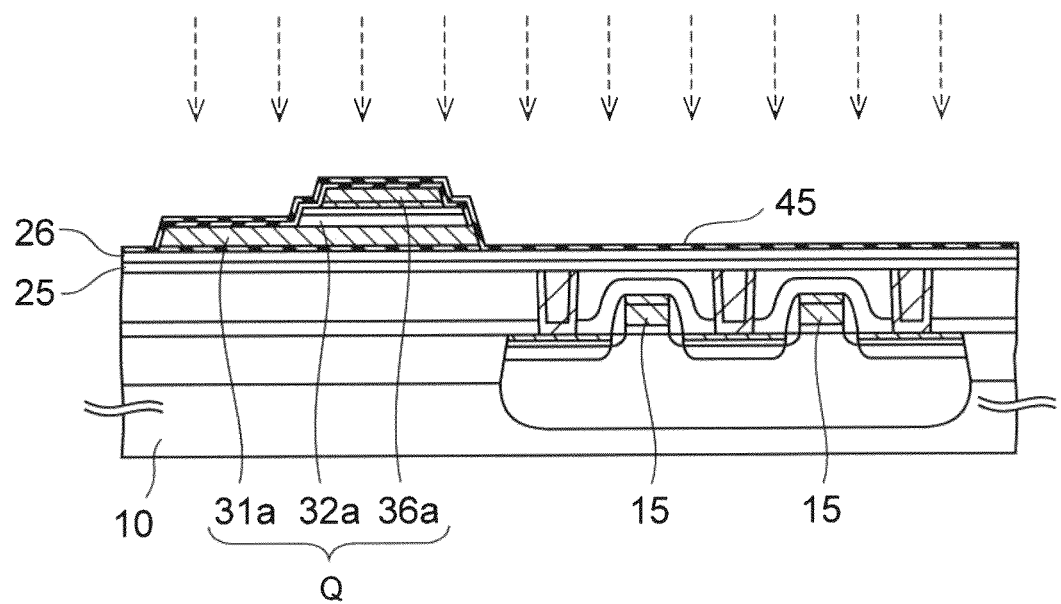
Figure 2S:
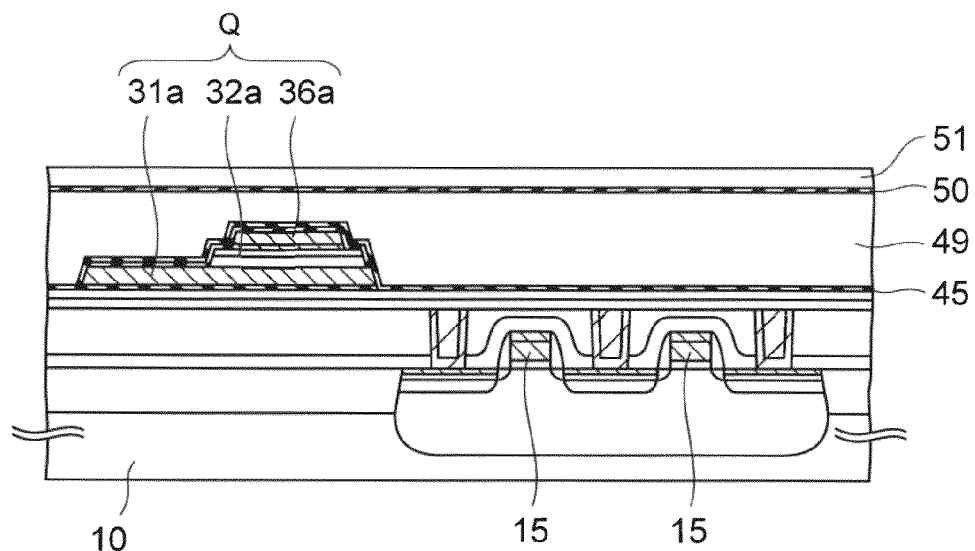
Figure 2T:
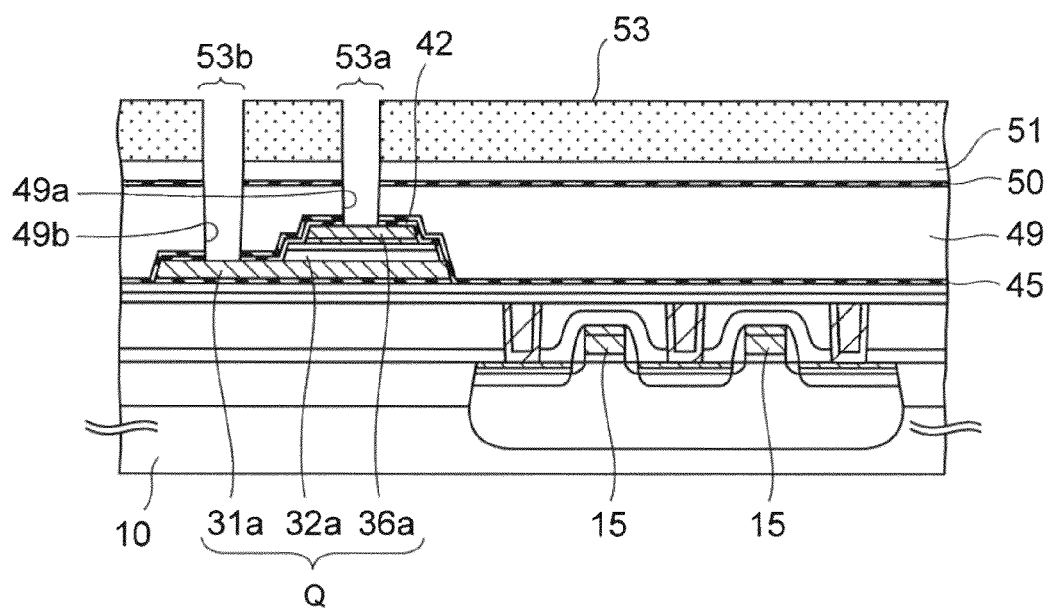
Figure 2U:
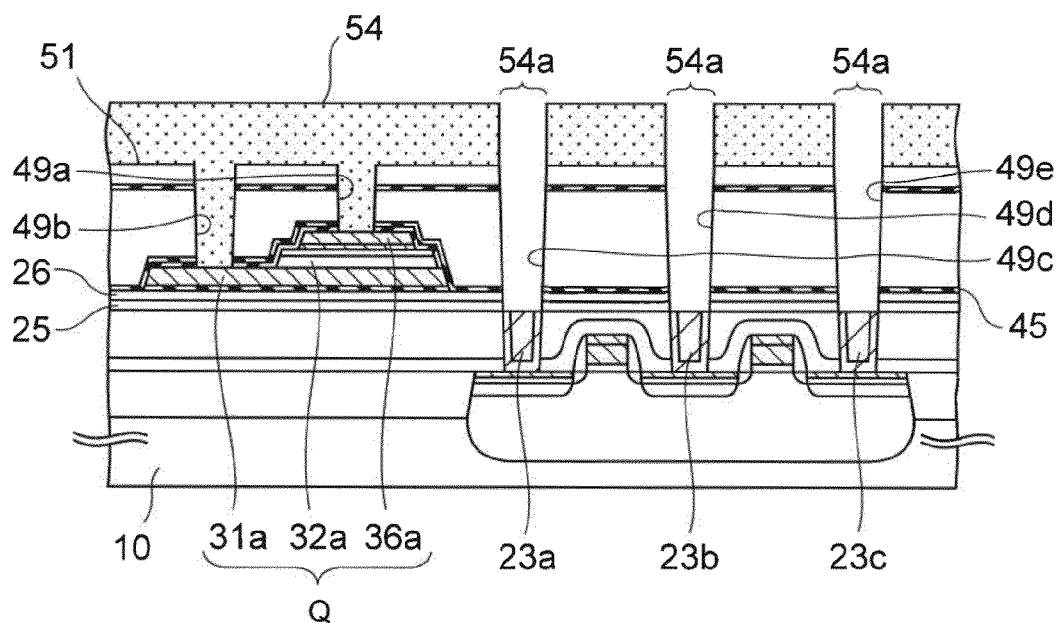
Figure 2V:
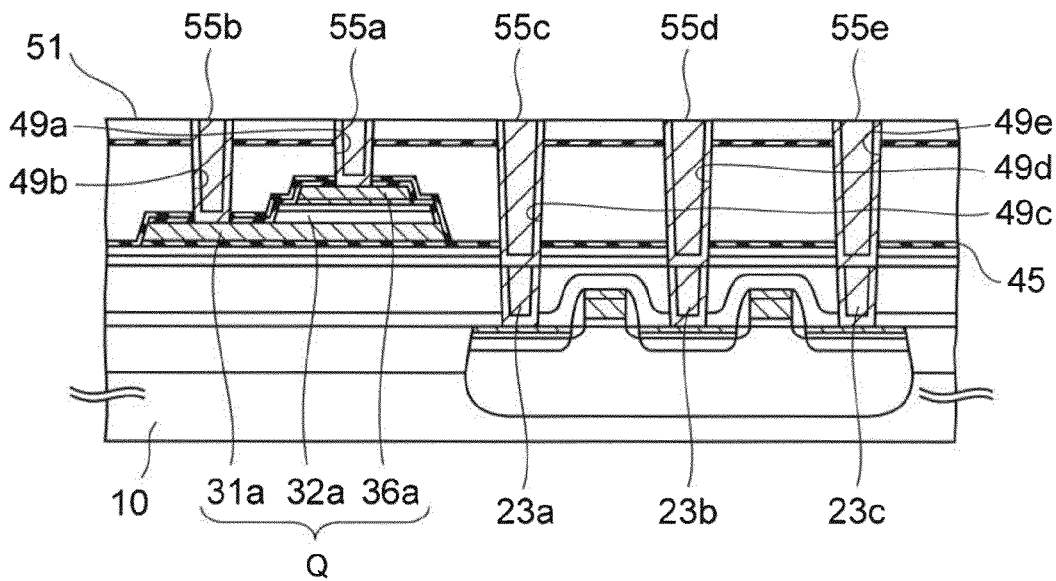
Figure 2W:
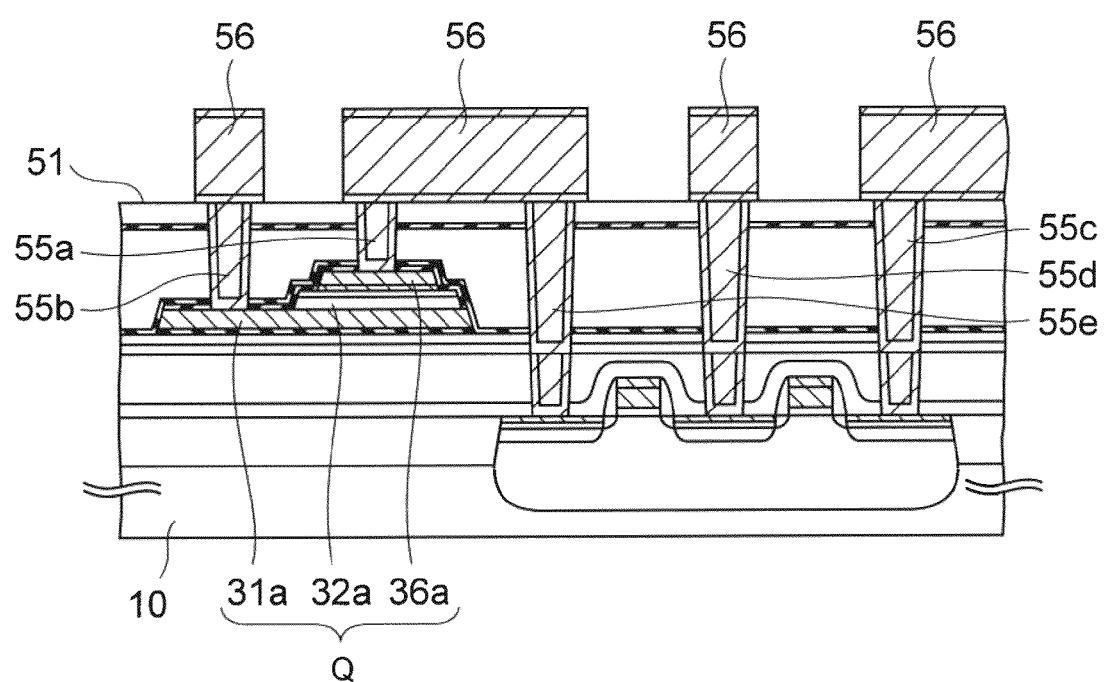

FIGS. 2A to 2W illustrate in sectional views a semiconductor device according to the first embodiment in the course of manufacturing.

This semiconductor device is a planar FeRAM, and is manufactured in the following manner.

Firstly, a description is given of processes for obtaining the cross section structure illustrated in FIG. 2A.

In the beginning, a Shallow Trench Isolation (STI) trench for drawing an active region of a transistor is formed on a surface of an n-type or p-type silicon substrate 10, and an insulating film such as a silicon oxide is filled in the trench to form an element isolation insulating film 11. Note that the silicon substrate 10 is an example of a semiconductor substrate.

In addition, the element isolation structure is not limited to STI, and the element isolation insulating film 11 may be formed by Local Oxidation of Silicon (LOCOS).

Then, after introducing a p-type impurity into the active region of the silicon substrate 10 to form a p well 12, a surface of the active region is thermally oxidized to form a thermally oxidized film serving as a gate insulating film 14.

Next, a polycrystalline silicon film is formed with approximately 200 nm thickness on an entire top surface of the silicon substrate 10, and the polycrystalline silicon film is patterned by photolithography to form gate electrodes 15.

On the p well 12, two gate electrodes 15 are positioned almost parallel to each other with a space in between. The gate electrodes 15 become a part of a word line.

The gate electrodes 15 are not limited to the polycrystalline silicon film. Instead of the polycrystalline silicon film, an amorphous silicon film of approximately 50 nm thickness and a tungsten silicide film of approximately 150 nm thickness may be formed in this order.

Thereafter, by ion-implantation using the gate electrodes 15 as a mask, an n-type impurity such as phosphorous is introduced into the silicon substrate 10 at sides of each gate electrode 15 to form first to third source and drain extensions 16a to 16c.

Then, an insulating film is formed on an entire top surface of the silicon substrate 10, and the insulating film is etched back to be left as insulating side walls 17 next to the gate electrodes 15. A silicon oxide film is formed as the insulating film by Chemical Vapor Deposition (CVD), for example.

Subsequently, another n-type impurity such as arsenic is implanted by ion implantation into the silicon substrate 10 by using the insulating side walls 17 and the gate electrodes 15 as a mask, to form first to third source and drain regions 18a to 18c in the silicon substrate 10 at sides of the gate electrodes 15.

With these processes, a MOS transistor TR including the gate insulating film 14, the gate electrodes 15, the first to third source and drain regions 18a to 18c, and the like is formed on the active region of the silicon substrate 10.

Next, after forming a refractory metal layer such as a cobalt layer on an entire top surface of the silicon substrate 10 by sputtering, the refractory metal layer is reacted with silicon by being heated to form a refractory metal silicide layer 19 on the silicon substrate 10. The refractory metal silicide layer 19 is also formed on surface portions of the gate electrodes 15, and thus resistance of the gate electrodes 15 is lowered.

Thereafter, the unreacted refractory metal layer left on portions such as the element isolation insulating film 11 are removed by wet etching.

Subsequently, a silicon oxynitride film is formed with approximately 200 nm thickness to serve as a cover insulating film 21, on an entire top surface of the silicon substrate 10.

Next, after forming a silicon oxide film of approximately 1000 nm thickness to serve as a first interlayer insulating film 22 on the cover insulating film 21 by plasma CVD using Tetraethyl orthosilicate (TEOS) gas, a top surface of the first interlayer insulating film 22 is polished and made flat by Chemical Mechanical Polishing (CMP). The thickness of the thus polished first interlayer insulating film 22 is approximately 785 nm on a flat surface of the silicon substrate 10.

Then, contact holes are respectively formed above the first to third source and drain regions 18a to 18c by patterning the first interlayer insulating film 22 by photolithography, and first to third contact plugs 23a to 23c are respectively formed in the contact holes.

The method of forming the first to third contact plugs 23a to 23c is not particularly limited. In the first embodiment, the first to third contact plugs 23a to 23c are formed by making a glue film and a tungsten film in this order in the contact holes, and then polishing and removing excess portions of these films on the surface of the first interlayer insulating film 22 by CMP. The glue film is formed by making a titanium film of approximately 30 nm thickness and a titanium nitride film of approximately 20 nm thickness in this order by sputtering, for example.

The thus formed first to third contact plugs 23a to 23c are to be electrically connected to the first to third source and drain regions 18a to 18c respectively positioned below the first to third contact plugs 23a to 23c.

As mentioned above, tungsten is included in the materials of the first to third contact plugs 23a to 23c. Tungsten is easily oxidized, and when oxidized in a process, causes a contact failure.

Hence, in the next process, as illustrated in FIG. 2B, a silicon oxynitride film is formed by plasma CVD to serve as an oxidation prevention insulating film 25 for protecting the above first to third contact plugs 23a to 23c from an oxidative atmosphere. The silicon oxynitride film is formed on the first interlayer insulating film 22 and on the first to third contact plugs 23a to 23c with approximately 100 nm thickness.

Furthermore, a silicon oxide film is formed with approximately 130 nm thickness to serve as a first insulative adhesion film 26, on the oxidation prevention insulating film 25 by plasma CVD using TEOS gas.

Note that a silicon nitride film may be formed instead of the silicon oxide film to serve as the first insulative adhesion film 26.

Thereafter, in order for degasification, the first insulative adhesion film 26 is annealed in a nitrogen atmosphere under conditions that the substrate temperature is 650° C. and the treatment time is 10 minutes.

Then, after the annealing, an alumina film is formed with approximately 20 nm thickness to serve as a second insulative adhesion film 27, on the first insulative adhesion film 26 by sputtering.

Next, a description is given of processes for obtaining the cross section structure illustrated in FIG. 2C.

Firstly, a noble metal film such as a platinum film is formed with 50 nm to 150 nm thickness, to serve as a conductive film 31 by sputtering.

Film-forming conditions for the conductive film 31 are not particularly limited. In the first embodiment, the conductive film 31 oriented in a (111) direction is formed by introducing argon gas as a sputtering gas into a film-forming atmosphere while keeping the substrate temperature at 350° C., and sputtering with 0.3 kW power under approximately 1 Pa pressure.

Note that instead of the platinum film, another film such as an iridium film, a ruthenium film, an iridium oxide ($IrO_2$) film, a ruthenium oxide ($RuO_2$) film, a palladium oxide ($PdO_x$) film, a platinum oxide ($PtO_x$) film, a $SrRuO_3$ film, or a $LaSrCoO_3$ film may be formed as a single layer film, or otherwise, a laminate of these films may be formed.

Then, under condition that the substrate temperature is between 30° C. to 100° C., a first ferroelectric film 32 is formed on the conductive film 31 by RF sputtering.

Materials of the first ferroelectric film 32 are not particularly limited. In the first embodiment, a PZT film to which calcium, strontium, and lanthanum are added is formed as the first ferroelectric film 32 with a thickness of approximately 30 nm to 150 nm, such as 70 nm.

Such a PZT film may be formed by sputtering a CPSLZT target in an atmosphere of an inert gas such as argon gas, the CPSLZT target being made by adding calcium, strontium, and lanthanum to PZT.

The minimum thickness of the first ferroelectric film 32 is set to 30 nm because if formed thinner, the first ferroelectric film 32 does not fully exert its ferroelectric characteristic. Meanwhile, the maximum thickness thereof is set to 150 nm because if formed thicker, a space between later-mentioned bottom electrode and top electrode is widened, an electric field to be applied to the first ferroelectric film 32 is weakened, and thus the operation voltage is not made low.

Here, the first ferroelectric film 32 formed by sputtering has a weak ferroelectric characteristic since PZT in the film is not crystallized.

For this reason, the first ferroelectric film 32 is annealed in an oxygen-containing atmosphere to crystallize the PZT. Such annealing is also called crystallization annealing, and in the first embodiment, this crystallization annealing is performed at a substrate temperature of approximately 610° C., and a treatment time of approximately 90 seconds.

As illustrated in the dotted circle, grain boundaries 32x of PZT appear in the first ferroelectric film 32 crystallized by this crystallization annealing.

Thus, by crystallizing the amorphous first ferroelectric film 32 by crystallization annealing, an interface between the conductive film 31 and the first ferroelectric film 32 may be made smooth and flat.

Note that methods for forming the first ferroelectric film 32 other than sputtering include: Metal Organic CVD (MOCVD), sol-gel processing, Metal-Organic Decomposition (MOD), Chemical Solution deposition (CSD), CVD, and epitaxy.

Further, a material of the first ferroelectric film 32 is not limited to the aforementioned PZT, and any ferroelectric oxide having an $ABO_3$ type perovskite structure may be used as the material of the first ferroelectric film 32. As this material, PLZT obtained by doping lanthanum into PZT may be used other than the aforementioned PZT.

In addition, a Bi-layered compound such as $(Bi_{1-x}R_x)Ti_3O_{12}$ (R is a rare earth element where 0<x<1), $SrBi_2Ta_2O_9$, $SrBi_2(Ta,Nb)_2O_9$, and $SrBi_4Ti_4O_{15}$ may be used as a material of the first ferroelectric film 32. In addition to those mentioned above, a material obtained by adding La to any of $BiFeO_3$, $BiTiO_3$, $SrBi_4Ti_4O_{15}$, and $BiTiO_3$ is also a Bi-layered compound usable as the material of the first ferroelectric film 32.

Next, as illustrated in FIG. 2D, a PZT film is formed to serve as a second ferroelectric film 33 on the first ferroelectric film 32 by RF sputtering using a CPSLZT target. By using the CPSLZT target, calcium, strontium, and lanthanum are added to the second ferroelectric film 33 at the time of forming the film. Moreover, the second ferroelectric film 33 thus formed by sputtering is not crystallized and is in an amorphous state upon completion of the film formation.

The second ferroelectric film 33 crystallizes from a bottom surface thereof and upwards, in a way as to take over the crystal of the first ferroelectric film 32 in later-mentioned crystallization annealing. At this time, if the second ferroelectric film 33 is formed thick, it also crystallizes from a top surface thereof, whereby its crystallizability near the top surface is deteriorated.

Furthermore, if the second ferroelectric film 33 is formed thick, a space between the later-mentioned bottom electrode and top electrode is widened, the electric field to be applied to the first ferroelectric film 32 by these electrodes is weakened, and thus it is difficult to polarize the first ferroelectric film 32 by the electric field.

To prevent such deterioration in crystallizability and lowering of electric field strength, the second ferroelectric film 33 is preferably formed as thin as possible such as a thickness of about 5 nm to 20 nm, or more preferably 10 nm to 15 nm. The minimum thickness is set to 5 nm because if formed thinner, the second ferroelectric film 33 does not fully exert its function to suppress leakage current.

Note that Methods for forming the amorphous second ferroelectric film 33 other than sputtering include Chemical Solution Deposition (CSD) and CVD.

In addition, a material of the second ferroelectric film 33 is not particularly limited either. However, it is preferable that a film made of the same material and having the same crystal structure as the first ferroelectric film 32 be formed to serve as the second ferroelectric film 33, so that the second ferroelectric film 33 may take over the crystal of the first ferroelectric film 32.

For example, in a case where the first ferroelectric film 32 is an $ABO_3$ type ferroelectric oxide, an $ABO_3$ type ferroelectric oxide made of the same material is preferably used as a material of the second ferroelectric film 33.

Similarly, in a case where the first ferroelectric film 32 is a Bi-layered compound, a Bi-layered compound made of the same material is preferably used as a material of the second ferroelectric film 33.

Subsequently, as illustrated in FIG. 2E, an amorphous SRO film is formed with approximately 0.5 nm to 3.0 nm thickness to serve as a transition metal oxide material film 34, on the second ferroelectric film 33 by DC sputtering. The minimum thickness is set to 0.5 nm because if formed thinner, variation in the thickness of the transition metal oxide material film 34 within the substrate surface becomes large. Meanwhile, the maximum thickness thereof is set to 3.0 nm because if formed thicker, strontium, ruthenium, and the like in the transition metal oxide material film 34 diffuse excessively into the first ferroelectric film 32 or the second ferroelectric film 33, and may cause deterioration in the ferroelectric characteristic of these films.

Film-forming conditions for the transition metal oxide material film 34 are not particularly limited. In the first embodiment, the transition metal oxide material film 34 is formed under conditions that: an SRO ceramic target having a diameter of approximately 300 mm is used, the sputtering power is 0.35 kW, pressure in the chamber is 0.5 Pa, and the film-forming time is 10 to 42 seconds.

When oxygen is added to the sputtering gas for the transition metal oxide material film 34, the film-forming speed is slowed down and film quality of the transition metal oxide material film 34 is deteriorated. Accordingly, it is preferable that the aforementioned DC sputtering be performed by using argon gas from which oxygen is removed as the sputtering gas.

As is mentioned later, the transition metal oxide material film 34 has a role of causing appropriate amounts of atoms such as strontium, ruthenium, and the like to diffuse into the second ferroelectric film 33. To facilitate diffusion of these atoms, it is preferable to form the transition metal oxide material film 34 in an amorphous state instead of crystallizing and stabilizing the film quality of the transition metal oxide material film 34.

The crystalline state of the transition metal oxide material film 34 depends on the temperature at which it is formed. In a case where the transition metal oxide material film 34 is formed at a substrate temperature higher than 350° C., SRO in the film is crystallized by the heat treatment, and thus crystal orientation of the film becomes disordered. Hence, in the first embodiment, the substrate temperature at the time of forming the transition metal oxide material film 34 is set to room temperature of (20° C.) to 350° C., or more preferably 50° C. to 70° C., such as 60° C., to thereby form the transition metal oxide material film 34 in an amorphous state.

In addition, it is preferable that the SRO target used in forming the transition metal oxide material film 34 be added approximately 2 wt % bismuth oxide ($Bi_2O_3$). It is made clear that density of the transition metal oxide material film 34 increases and its film quality is improved, by thus adding the bismuth oxide.

Furthermore, a material of the transition metal oxide material film 34 is not limited to SRO either, and any transition metal oxide having an $ABO_3$ type perovskite structure when crystallized may be used as a material of the transition metal oxide material film 34. As this material, $CaRuO_3$, $BaRuO_3$, $La_4Ru_2O_{10}$, $LaSrCoRuO_3$, $LaSrRuO_3$, and $LaSrMnRuO_3$ may be used other than SRO.

Since the SRO film formed to serve as the transition metal oxide material film 34 is highly hygroscopic, the transition metal oxide material film 34 captures moist when it is exposed to the air. The moist reduces the first ferroelectric film 32 and the second ferroelectric film 33, and causes deterioration in the ferroelectric characteristic of these ferroelectric films.

For this reason, in the first embodiment, the semiconductor substrate 10 is placed in a reduced-pressure atmosphere without taking it out of a semiconductor manufacturing apparatus used for forming the transition metal oxide material film 34. Hence, the next process is performed without exposing the transition metal oxide material film 34 to the air.

In this process, as illustrated in FIG. 2F, an iridium oxide film is formed to serve as a first conductive metal oxide film 35 on the transition metal oxide material film 34 by reactive sputtering, where an iridium target is sputtered in a mixed atmosphere including oxygen gas and argon gas.

The substrate temperature at the time of forming the first conductive metal oxide film 35 is not particularly limited. Note, however, that when the substrate temperature is lower than 150° C., the first conductive metal oxide film 35 includes a mixture of an amorphous iridium oxide and a crystallized iridium oxide. If heat is added to the first conductive metal oxide film 35 in this state in the following processes, a difference in crystal grain size occurs between the iridium oxide crystallized from the amorphous state and the already-crystallized iridium oxide, making the crystal grains uneven in the first conductive metal oxide film 35.

With such uneven crystal grains, the amount of iridium diffusing from the first conductive metal oxide film 35 into the second ferroelectric film 33 varies, and there is fear that an amorphous layer due to iridium may be formed locally in the second ferroelectric film 33. For this reason, it is preferable that the aforementioned substrate temperature be set to 150° C. or higher, so that the entire first conductive metal oxide film 35 is crystallized at the time of forming the film.

Meanwhile, when the aforementioned substrate temperature is higher than 350° C., the iridium oxide grows abnormally and causes defects such as holes in an interface between the first conductive metal oxide film 35 and the transition metal oxide material film 34. Hence, the substrate temperature is preferably set to 350° C. or lower.

In consideration of the above, in the first embodiment, the first conductive metal oxide film 35 is formed by setting the substrate temperature to 300° C., a film-forming time to approximately 8 seconds, and a film-forming pressure to approximately 2.0 Pa. In addition, a flow volume of argon gas is about 140 sccm, a flow volume of oxygen gas is about 60 sccm, and sputtering power is approximately 1 kW.

Note that the amount of iridium diffusing from the first conductive metal oxide film 35 into the second ferroelectric film 33 is considered to depend on a composition ratio x of oxygen in the iridium oxide ($IrO_x$) contained in the first conductive metal oxide film 35, and the smaller the composition ratio, the more the iridium diffusion is suppressed. Accordingly, in this process, it is preferable that the flow ratio between oxygen gas and argon gas be controlled to set the aforementioned composition ratio x of oxygen to a value smaller than 2, which is the stoichiometric composition, such as about 1.9.

Note that as a material of the first conductive metal oxide film 35, an oxide of any of ruthenium, rhodium (Rh), rhenium (Re), osmium (Os), and palladium (Pd) may be used other than the aforementioned iridium oxide.

Thereafter, as illustrated in FIG. 2G, Rapid Thermal Anneal (RTA) is performed in a mixed atmosphere including argon gas and oxygen gas for approximately 120 seconds, as crystallization annealing on the amorphous second ferroelectric film 33.

With this treatment, ruthenium in the transition metal oxide material film 34 and an appropriate amount of iridium in the first conductive metal oxide film 35 thermally diffuse into the second ferroelectric film 33, the second ferroelectric film 33 crystallizes from the amorphous state, and PZT crystal grain boundaries 33x appear in the second ferroelectric film 33.

Although the PZT has an $ABO_3$ type perovskite structure, the B site of PZT is replaced with ruthenium or iridium by the aforementioned thermal diffusion, and thus ruthenium and iridium are incorporated into the crystal of the PZT.

Accordingly, the $ABO_3$ type perovskite structure of the second ferroelectric film 33 is maintained even with thermal diffusion of ruthenium and iridium. Hence, the ferroelectric substance in the second ferroelectric film 33 does not change into a paraelectric substance, and thus it may be possible to prevent the paraelectric layer 3a as illustrated in FIG. 1 from being formed.

In addition, crystal defects of PZT in the second ferroelectric film 33 are compensated by the thermally diffused ruthenium and iridium, whereby an imprint characteristic of the second ferroelectric film 33 is improved.

Moreover, since the second ferroelectric film 33 crystallizes with ruthenium and iridium incorporated therein, there is no room for a large amount of iridium to diffuse into the second ferroelectric film 33 from the first conductive metal oxide film 35. Furthermore, separation of the second ferroelectric film 33 from the first conductive metal oxide film 35 by the transition metal oxide material film 34 may also prevent excessive diffusion of iridium from the first conductive metal oxide film 35 into the second ferroelectric film 33.

As a result, even when the first conductive metal oxide film 35 is heated in the following processes, it is less likely that iridium in the first conductive metal oxide film 35 will diffuse into the second ferroelectric film 33 or the first ferroelectric film 32, and thus no paraelectric layer due to iridium is formed in these ferroelectric films 32, 33.

Further, since the second ferroelectric film 33 is crystallized with no paraelectric layer formed therein, an interface between the second ferroelectric film 33 and the first conductive metal oxide film 35 is made smooth and flat. As compared to a rough interface, a flat interface is highly effective in preventing mutual diffusion of elements in films. Hence, it may be possible to prevent iridium in the first conductive metal oxide film 35 from diffusing into the second ferroelectric film 33 even more effectively.

Additionally, this crystallization annealing also has an effect of enhancing the adhesion between the second ferroelectric film 33 and the first conductive metal oxide film 35.

Note, however, that when the substrate temperature at the time of crystallization annealing is low, the shape of interface between the second ferroelectric film 33 and the first conductive metal oxide film 35 becomes uneven within the substrate face, so that the amount of charge reversal varies among ferroelectric capacitors. In addition, when crystallization annealing is performed at a low substrate temperature, it is difficult to stimulate thermal diffusion of ruthenium and iridium into the second ferroelectric film 33.

Accordingly, crystallization annealing is preferably performed at a high substrate temperature such as about 700° C. to 750° C., or more preferably, approximately 725° C.

In addition, if a rate of oxygen gas in the annealing atmosphere exceeds a flow rate of 10%, the iridium oxide in the first conductive metal oxide film 35 may oxidize abnormally. Meanwhile, if the flow rate of the oxygen gas is 0.5% or lower, oxygen contained in the iridium oxide in the first conductive metal oxide film 35 flows into the annealing atmosphere, and the first conductive metal oxide film 35 becomes excessively deficient in oxygen.

Accordingly, in the first embodiment, the flow amount of argon gas is selected from a range of 1500 sccm to 3000 sccm, and the flow amount of oxygen gas is selected from a range of 10 sccm to 100 sccm, to make the flow rate of oxygen gas not less than 1% and not more than 10%. The minimum flow rate is set to 1% in order to add allowance to the aforementioned rate of 0.5%, where severe oxygen deficiency occurs in the first conductive metal oxide film 35.

Note that crystallization annealing in this process also serves to compensate for oxygen deficiency in the second ferroelectric film 33, by supplying oxygen in the annealing atmosphere to the second ferroelectric film 33 through the first conductive metal oxide film 35.

For this reason, in order to maintain oxygen permeability of the first conductive metal oxide film 35, the first conductive metal oxide film 35 is preferably formed as thin as possible, such as about 10 nm to 70 nm, more preferably about 20 nm to 50 nm, or furthermore preferably about 25 nm.

Next, as illustrated in FIG. 2H, an iridium oxide film is formed with a thickness of about 70 nm to 200 nm, such as 150 nm, to serve as a second conductive metal oxide film 36 on the first conductive metal oxide film 35 by reactive sputtering.

In the reactive sputtering, an iridium target is used, and a mixed gas including oxygen gas and argon gas is used as a sputtering gas. Pressure of the sputtering gas is approximately 0.8 Pa, and the sputtering power is approximately 1.0 kW. In addition, the film-forming time is approximately 59 seconds.

The composition ratio of the iridium oxide ($IrO_y$) in the second conductive metal oxide film 36 is not particularly limited. However, the second conductive metal oxide film 36 preferably has a composition ratio satisfying y>x where the iridium oxide in the first conductive metal oxide film 35 is expressed by a general formula $IrO_x$, and more preferably has the stoichiometric composition where y is 2.

By thus enlarging the composition ratio y, an ability of the second conductive metal oxide film 36 in preventing hydrogen from diffusing is enhanced. Accordingly, it may be possible to prevent the first ferroelectric film 32 and the second ferroelectric film 33 from being reduced by hydrogen.

The composition ratio y may be made larger than the composition ratio x by making a flow rate of oxygen gas in the sputtering gas larger than that at the time of forming the first conductive metal oxide film 35. This is achieved in the first embodiment by setting the flow amount of argon gas to approximately 100 sccm, and the flow amount of oxygen gas to approximately 100 sccm.

In the case of thus enlarging the composition ratio y, the substrate temperature at the time of forming the second conductive metal oxide film 36 is preferably set to 10° C. to 100° C., or more preferably to 50° C. to 75° C., so that the sizes of crystal grains of the iridium oxide in the second conductive metal oxide film 36 become uniform. As a result, gaps in grain boundaries in the second conductive metal oxide film 36 are narrowed, whereby external hydrogen is inhibited from passing through the gaps to reach the second ferroelectric film 33. Hence, it may be possible to prevent the second ferroelectric film 33 from being reduced and deteriorated by hydrogen.

Moreover, to enhance the ability of the second conductive metal oxide film 36 of preventing hydrogen from diffusing, it is preferable that the second conductive metal oxide film 36 be formed thicker than the first conductive metal oxide film 35.

Note that as a material of the second conductive metal oxide film 36, an oxide of any of ruthenium, rhodium, rhenium, osmium, and palladium may be used other than the aforementioned iridium oxide.

Thereafter, PZT having attached to a back surface of the semiconductor substrate 10 when forming the first ferroelectric film 32 and the second ferroelectric film 33 is removed by cleaning.

Next, as illustrated in FIG. 2I, a titanium nitride film is formed with approximately 30 nm thickness to serve as a hard mask 37, on the second conductive metal oxide film 36 by sputtering.

The hard mask 37 is not particularly limited as long as it is a film whose etch rate is lower than that of a resist. Instead of the titanium nitride film, a TiON film, a $TiO_x$ film, a $TaO_x$ film, a TaON film, a $TiAlO_x$ film, a $TaAlO_x$ film, a TiAlON film, a TaAlON film, a TiSiON film, a TaSiON film, a $TiSiO_x$ film, a $TaSiO_x$ film, an $AlO_x$ film, a $ZrO_x$ film or the like may be formed to serve as the hard mask 37, for example.

Further, a photoresist is applied onto the hard mask 37, and the photoresist is exposed and developed to form a first resist pattern 38 in the shape of a capacitor top electrode.

Then, as illustrated in FIG. 2J, the hard mask 37 is dry etched by using the first resist pattern 38 as a mask, so that the hard mask 37 is patterned to form in the shape of a capacitor top electrode.

The dry etching is performed in an unillustrated Inductively Coupled Plasma (ICP) etching chamber into which a mixed gas including chlorine gas and argon gas is supplied as an etching gas.

Next, as illustrated in FIG. 2K, the first conductive metal oxide film 35 and the second conductive metal oxide film 36 are dry etched by using the hard mask 37 and the first resist pattern 38 as a mask in the aforementioned ICP etching chamber, to form a top electrode 36a.

As an etching gas for the etching, a mixed gas including chlorine gas and argon gas is used as in the case of etching the hard mask 37.

Then, after removing the first resist pattern 38 by asking, the hard mask 37 is removed by dry etching.

Note that after removing the hard mask 37, the first ferroelectric film 32 and the second ferroelectric film 33 may be annealed in an oxygen-containing atmosphere, so that the damaged films may be restored. Such annealing is called recovery annealing.

In the first embodiment, the recovery annealing is performed for approximately 40 minutes under condition that the substrate temperature is 600° C. to 700° C.

Subsequently, as illustrated in FIG. 2L, a photoresist is applied onto an entire top surface of the silicon substrate 10, and the photoresist is exposed and developed to form a second resist pattern 41 in the shape of a capacitor dielectric film.

Further, the first ferroelectric film 32 and the second ferroelectric film 33 are dry etched by using the second resist pattern 41 as a mask, and the remainders of the first ferroelectric film 32 and the second ferroelectric film 33 form a capacitor dielectric film 32a.

Thereafter, the second resist pattern 41 is removed by asking.

Then, recovery annealing is performed on the capacitor dielectric film 32a in an oxygen-containing atmosphere for a treatment time of 30 to 120 minutes, under condition that the substrate temperature is 300° C. to 650° C.

Next, as illustrated in FIG. 2M, an alumina film is formed with 20 nm to 50 nm thickness by RF magnetron sputtering, to serve as a first protective insulating film 42 for protecting the capacitor dielectric film 32a from a reducing atmosphere such as hydrogen.

Subsequently, as illustrated in FIG. 2N, recovery annealing is performed on the capacitor dielectric film 32a in an oxygen-containing atmosphere, so that the capacitor dielectric film 32a may recover from the damage caused at the time of forming the first protective insulating film 42.

The recovery annealing is performed under conditions that the substrate temperature is 400° C. to 600° C., and the treatment time is 30 to 120 minutes, for example.

Next, as illustrated in FIG. 2O, a photoresist is applied onto the first protective insulating film 42, and the photoresist is exposed and developed to form a third resist pattern 44 in the shape of a capacitor bottom electrode.

Then, the first protective insulating film 42 and the conductive film 31 are dry etched by using the third resist pattern 44 as a mask, and the remainder of the conductive film 31 forms a bottom electrode 31a. In addition, the first protective insulating film 42 is left to cover the capacitor dielectric film 32a and the top electrode 36a.

Thereafter, the third resist pattern 44 is removed by asking.

With these processes, a ferroelectric capacitor Q made by stacking a bottom electrode 31a, a capacitor dielectric film 32a, and a top electrode 36a in this order is formed above the silicon substrate 10.

Subsequently, as illustrated in FIG. 2P, the first protective insulating film 42 is annealed in an oxygen-containing atmosphere, so that impurities such as moist attached to the first protective insulating film 42 and residue of the third resist pattern 44 may be evaporated.

Although conditions for the annealing are not particularly limited, in the first embodiment, the annealing is performed under conditions that the substrate temperature is 300° C. to 400° C., and the treatment time is 30 to 120 minutes.

Next, as illustrated in FIG. 2Q, another alumina film is formed to serve as a second protective insulating film 45 on an entire top surface of the silicon substrate 10, to protect the capacitor dielectric film 32a from reducing substances.

The method for forming the second protective insulating film 45 is not particularly limited. In the first embodiment, the second protective insulating film 45 is formed with a thickness of about 10 nm to 30 nm, such as 20 nm by RF magnetron sputtering.

Here, if the second protective insulating film 45 is formed by sputtering, the capacitor dielectric film 32a may be damaged at the time of forming the second protective insulating film 45.

For this reason, in the next process, as illustrated in FIG. 2R, the damaged capacitor dielectric film 32a is restored by performing recovery annealing thereon in an oxygen-containing atmosphere.

The recovery annealing is performed under conditions that the substrate temperature is 500° C. to 700° C., and the treatment time is 30 to 120 minutes, for example.

Next, a description is given of processes for obtaining the cross section structure illustrated in FIG. 2S.

Firstly, a silicon oxide film is formed with approximately 1400 nm thickness to serve as a second interlayer insulating film 49, on the second protective insulating film 45 by plasma CVD using TEOS gas as a reactant gas. A top surface of the second interlayer insulating film 49 has an irregularity reflecting the shape of the capacitor Q. To remove the irregularity, the top surface of the second interlayer insulating film 49 is polished and made flat by CMP.

Note that after the CMP, the second interlayer insulating film 49 may be dehydrated by being annealed in a $N_2O$ plasma atmosphere.

Then, an alumina film is formed with 20 nm to 50 nm thickness on the second interlayer insulating film 49 by sputtering or CVD, to serve as a third protective insulating film 50 for protecting the capacitor Q from hydrogen and moist generated in the following processes.

Further, a silicon oxide film is formed with approximately 300 nm thickness to serve as a cap insulating film 51, on the third protective insulating film 50 by plasma CVD using TEOS gas.

Subsequently, as illustrated in FIG. 2T, a photoresist is applied onto the cap insulating film 51, and the photoresist is exposed and developed to form a fourth resist pattern 53 including first and second hole-shaped windows 53a and 53b.

Then, dry etching is performed from the cap insulating film 51 to the first protective insulating film 42 through the windows 53a and 53b, by using a mixed gas including $C_4F_8$, Ar, $O_2$, and CO as an etching gas. Thus, a first hole 49a is formed above the top electrode 36a, and a second hole 49b is formed above a contact region of the bottom electrode 31a.

After the etching, the fourth resist pattern 53 is removed.

Next, as illustrated in FIG. 2U, a photoresist is applied onto the cap insulating film 51, and the photoresist is exposed and developed to form a fifth resist pattern 54 including a third hole-shaped window 54a formed above each of the first to third contact plugs 23a to 23c. Note that the first and second holes 49a and 49b are covered by the fifth resist pattern 54.

Then, dry etching is performed from the cap insulating film 51 to the oxidation prevention insulating film 25 through the third windows 54a, so that third to fifth holes 49c to 49e are formed above the first to third contact plugs 23a to 23c, respectively.

Such etching is performed in a plasma etching apparatus in which a mixed gas including $C_4F_8$, Ar, $O_2$, and CO is used as an etching gas. In the etching, the oxidation prevention insulating film 25 serves as a stopper film, and the etching is stopped at the oxidation prevention insulating film 25.

In addition, a mixed gas including $CHF_3$, Ar, and $O_2$ is used as an etching gas for the oxidation prevention insulating film 25.

Thereafter, the fifth resist pattern 54 is removed.

Next, a description is given of processes for obtaining the cross section structure illustrated in FIG. 2V.

Firstly, to clean the insides of the first to fifth holes 49a to 49e, the insides thereof are exposed to an argon atmosphere plasmatized by high-frequency power, and are sputter etched.

Next, a titanium nitride film is formed with 50 nm to 150 nm thickness to serve as a glue film, by sputtering on insides of the first to fifth holes 49a to 49e and a top surface of the cap insulating film 51.

Then, a tungsten film is formed on the glue film by CVD, so that the first to fifth holes 49a to 49e are filled up with the tungsten film.

Thereafter, excess glue film and tungsten film on the top surface of the cap insulating film 51 are polished and removed by CMP, so that these films are left in the first to fifth holes 49a to 49e. The remainders of these films in the first and second holes 49a and 49b serve as first and second conductive plugs 55a and 55b to be electrically connected to the top electrode 36a and bottom electrode 31a, respectively. Moreover, the remainders of these films in the third to fifth holes 49c to 49e serve as third to fifth conductive plugs 55c to 55e to be electrically connected to the first to third contact plugs 23a to 23c, respectively.

Next, as illustrated in FIG. 2W, a metal stacked film is formed by sputtering on a top surface of each of the first to fifth conductive plugs 55a to 55e and the cap insulating film 51, and then the metal stacked film is patterned to form a metal wiring 56.

The metal stacked film includes, from the bottom in this order, a TiN film of 50 nm thickness, a copper-containing aluminum film of 550 nm thickness, a Ti film of 5 nm thickness, and a TiN film of 50 nm thickness.

Thus, the basic structure of the semiconductor device according to the first embodiment is completed.

Figure 3:
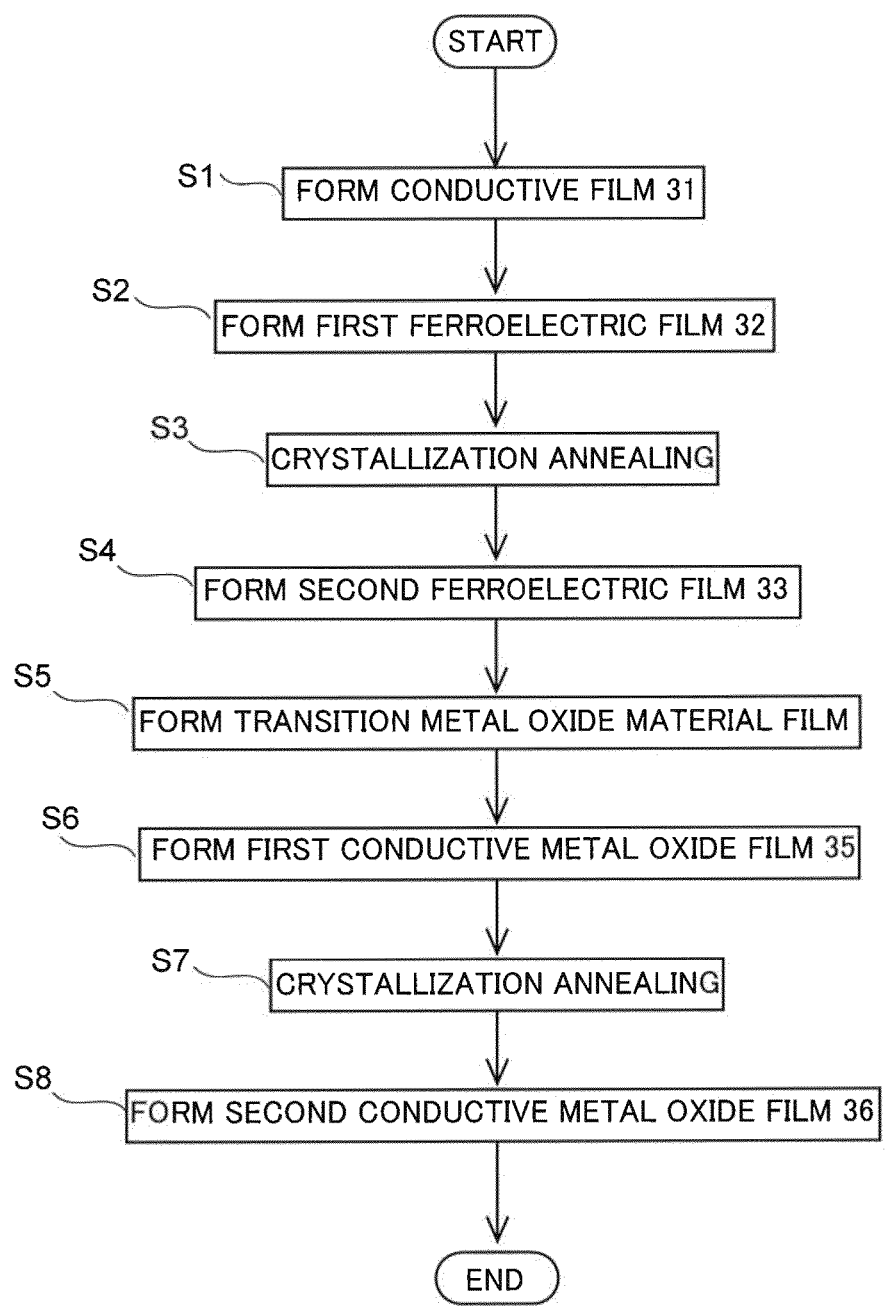
FIG. 3 is a flowchart illustrating basic steps of the method of manufacturing the semiconductor device according to the first embodiment.

FIG. 3 is a flowchart illustrating basic steps of the method of manufacturing the semiconductor device described above.

As illustrated in FIG. 3, in the first embodiment, the conductive film 31 later serving as the bottom electrode 31a is formed in step S1 (FIG. 2C), and the amorphous first ferroelectric film 32 is formed on the conductive film 31 in step S2 (FIG. 2C).

Thereafter, in step S3, the first ferroelectric film 32 is crystallized by crystallization annealing (FIG. 2C). Note that step S3 is unnecessary in a case of forming the first ferroelectric film 32 which is already crystallized by MOCVD or the like at the time of forming the film.

Then, in step S4, the amorphous second ferroelectric film 33 is formed on the first ferroelectric film 32 (FIG. 2D), and the transition metal oxide material film 34 is formed in step S5 (FIG. 2E).

Next, in step S6, the first conductive metal oxide film 35 is formed on the transition metal oxide material film 34 (FIG. 2F).

Since step S5 and step S6 are processed continuously in the same semiconductor manufacturing apparatus, the transition metal oxide material film 34 is not exposed to the air during these steps.

Then, in step S7, crystallization annealing is performed not only to crystallize the second ferroelectric film 33, but also to make the second ferroelectric film 33 capture ruthenium in the transition metal oxide material film 34 and iridium in the first conductive metal oxide film 35.

Thereafter, the second conductive metal oxide film 36 is formed on the first conductive metal oxide film 35, the second conductive metal oxide film 36 forming the top electrode 36a together with the first conductive metal oxide film 35.

Thus, since step S5 and step S6 are performed continuously in the same semiconductor manufacturing apparatus in the first embodiment, the transition metal oxide material film 34 including highly hygroscopic SRO is not exposed to the air during these steps.

Accordingly, the transition metal oxide material film 34 is less likely to absorb moist in the air, whereby reduction of the capacitor dielectric film 32a due to the moist may be suppressed, and the ferroelectric characteristic of the ferroelectric capacitor Q such as the amount of charge reversal may be maintained.

Furthermore, when PZT of the second ferroelectric film 33 is crystallized by crystallization annealing in step S7, the B site of PZT having an $ABO_3$ type perovskite structure is replaced with ruthenium or iridium.

Since the second ferroelectric film 33 is crystallized with ruthenium and iridium incorporated therein, there is no room for iridium to diffuse into the capacitor dielectric film 32a from the top electrode 36a. Hence, a paraelectric layer due to iridium is not formed in the capacitor dielectric film 32a.

With this configuration, an increase in the amount of charge reversal and improvement in the imprint characteristic of the ferroelectric capacitor Q may be achieved, as is described below.

Next, a description is given of a result of an investigation carried out to confirm the effects of the first embodiment.

FIGS. 4 to 7 are graphs obtained by performing Secondary Ion Mass Spectrometry (SIMS) to measure the depth-direction distribution of elements contained in the ferroelectric capacitor Q, manufactured according to the first embodiment.

The abscissa of the graphs indicates the time of flight of ions, which corresponds to a depth from the surface of the ferroelectric capacitor Q. In this example, an interface between the capacitor dielectric film 32a and the top electrode 36a is positioned near 1500 seconds, and an interface between the bottom electrode 31a and the capacitor dielectric film 32a is positioned near 2300 seconds.

Note that since the transition metal oxide material film 34 is thin, its reference numeral is omitted in FIGS. 4 to 7.

In addition, the ordinate of these graphs is a counted number of ions of each detected element per unit time.

Figure 4:
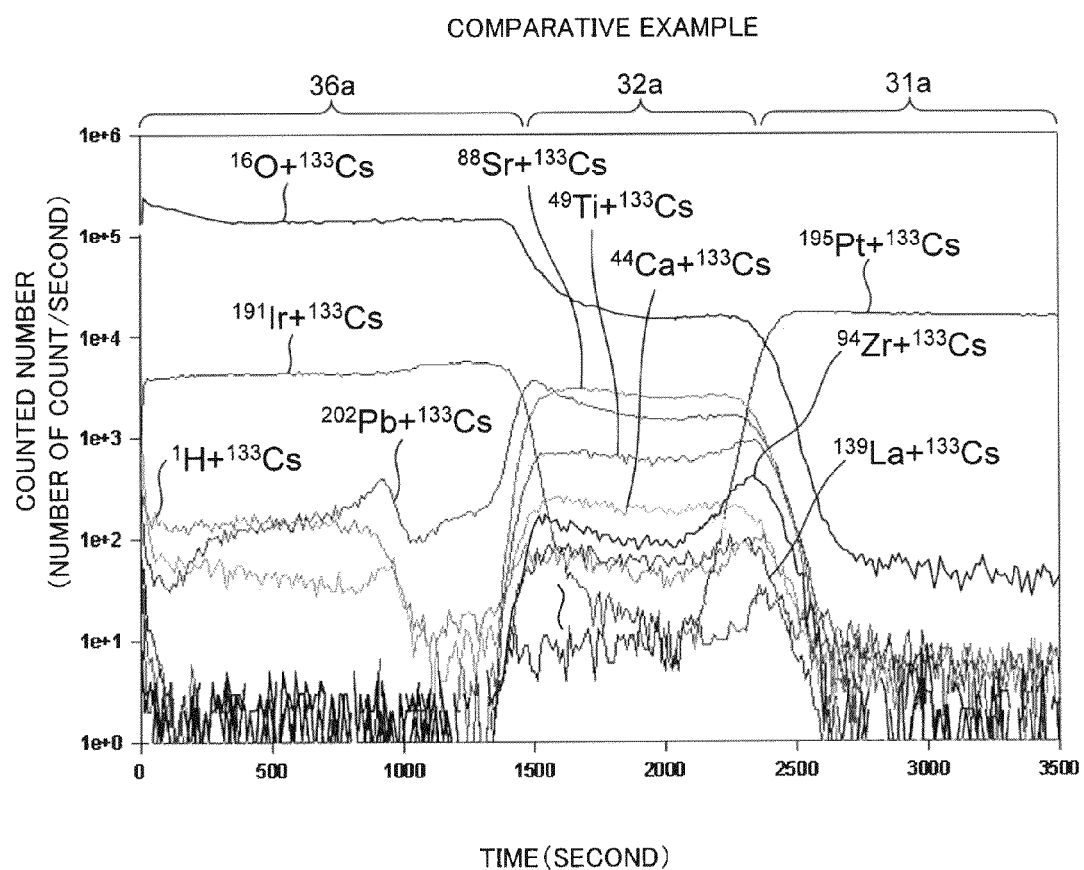
FIG. 4 is a graph (1) obtained by performing secondary ion mass spectrometry to measure the depth-direction distribution of elements contained in a ferroelectric capacitor according to a comparative example.
Figure 5:
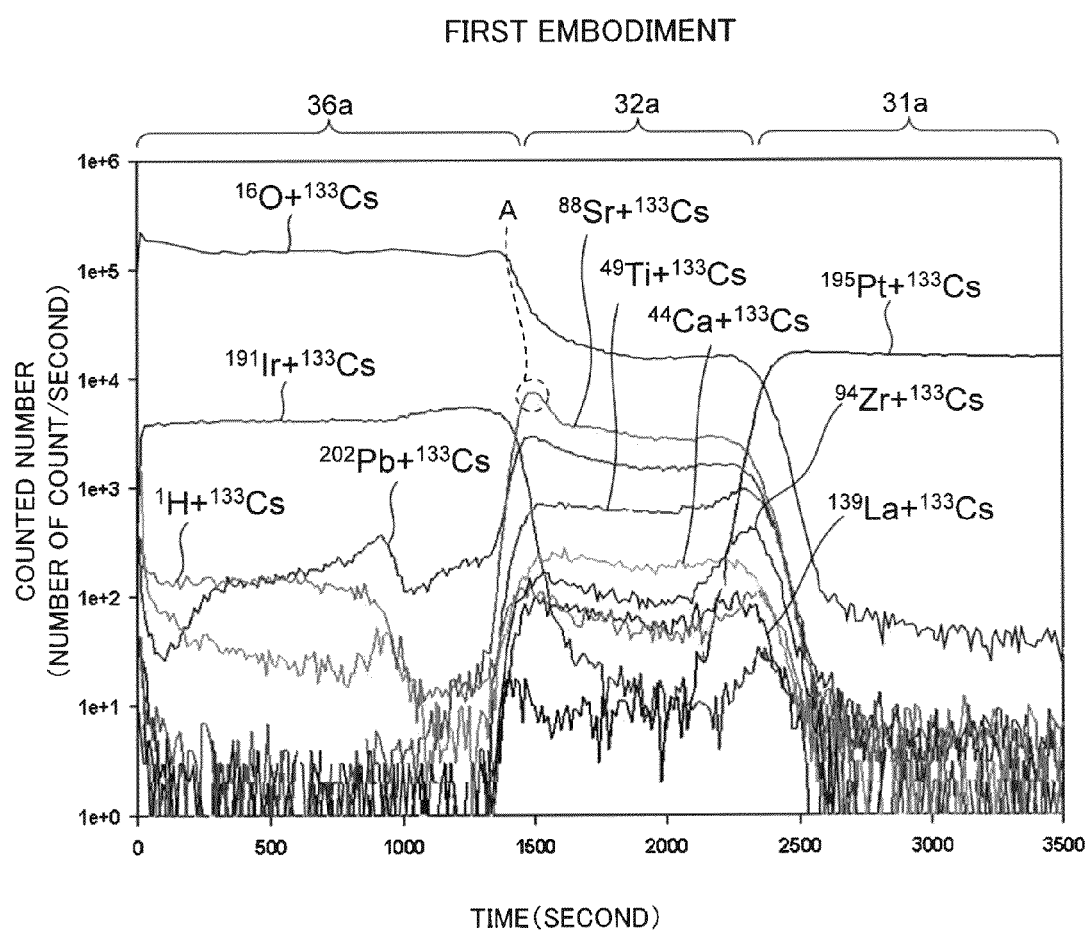
FIG. 5 is a graph (1) obtained by performing secondary ion mass spectrometry to measure the depth-direction distribution of elements contained in a ferroelectric capacitor manufactured according to the first embodiment.

FIG. 4 is a graph according to a comparative example in which the transition metal oxide material film 34 is not formed, and FIG. 5 is a graph obtained by carrying out the same investigation as FIG. 4 on the first embodiment.

In the first embodiment illustrated in FIG. 5, a peak is generated in strontium (Sr) due to the transition metal oxide material film 34, and an edge of the peak extends to the capacitor dielectric film 32a. In contrast, there is no such peak in the comparative example illustrated in FIG. 4.

Thus, it is confirmed that by forming the transition metal oxide material film 34, strontium contained in the transition metal oxide material film 34 diffuses into the capacitor dielectric film 32a.

Figure 6:
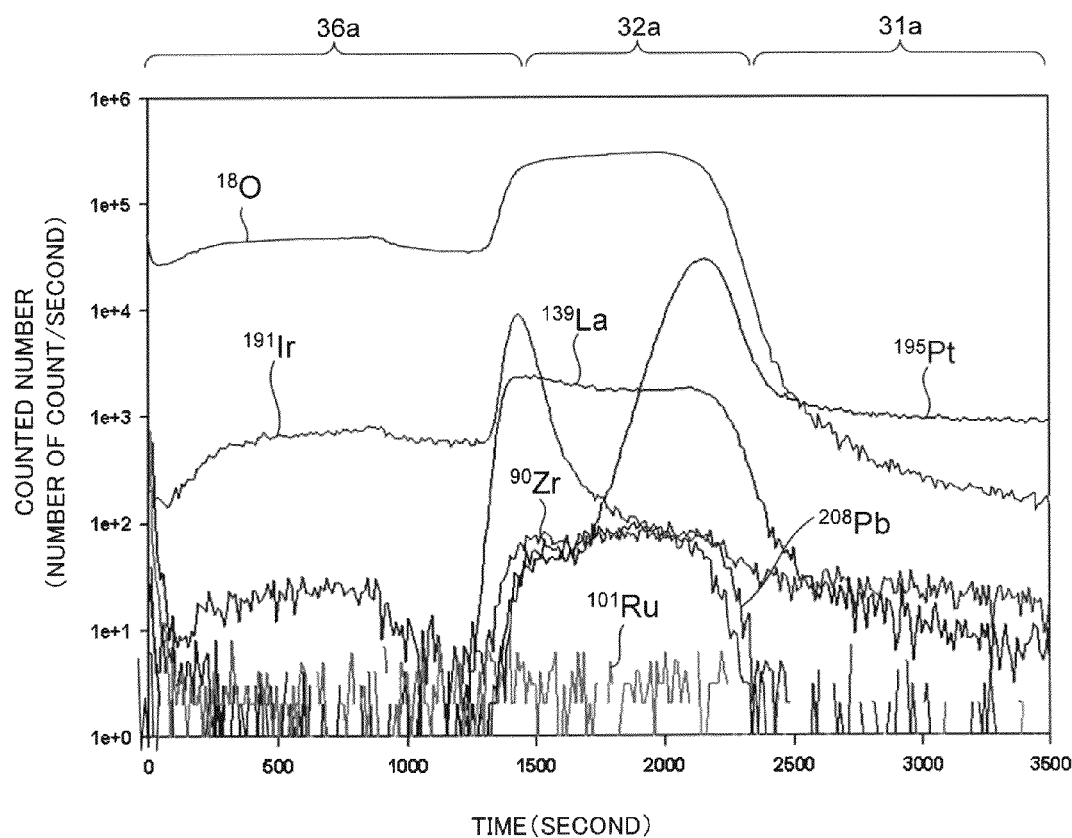
FIG. 6 is a graph (2) obtained by performing secondary ion mass spectrometry to measure the depth-direction distribution of elements contained in a ferroelectric capacitor according to a comparative example.
Figure 7:
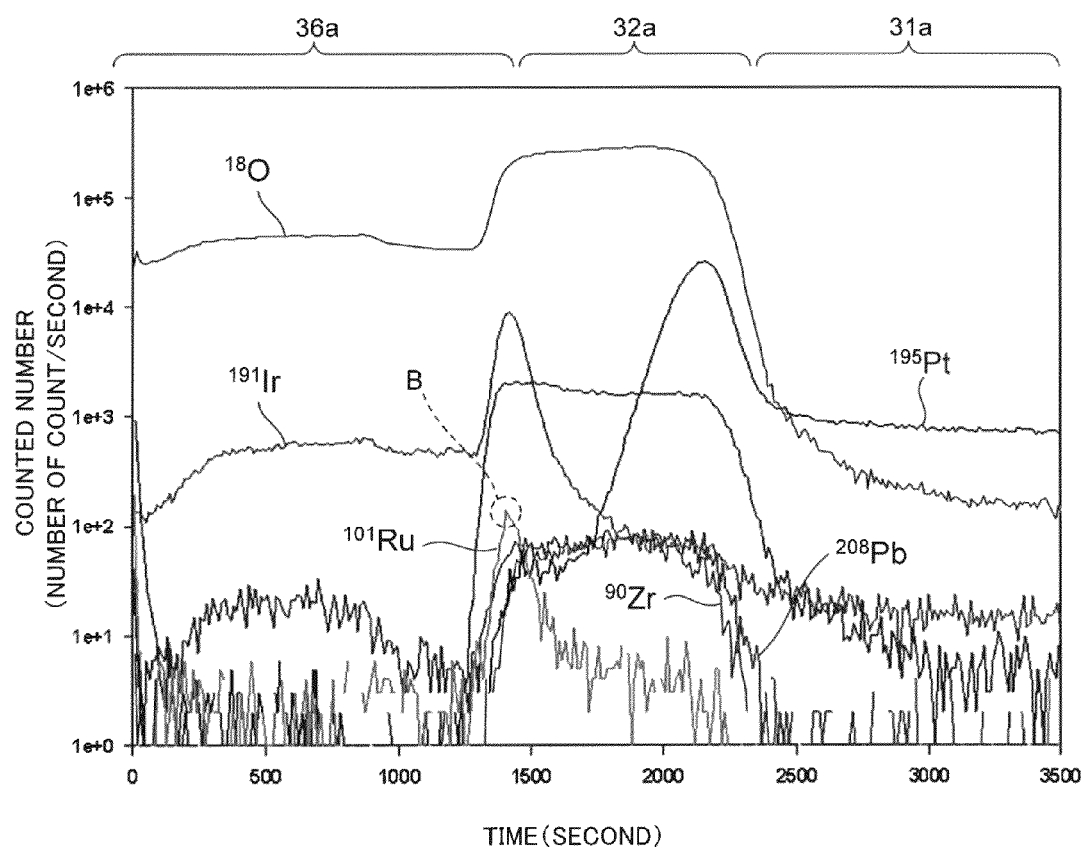
FIG. 7 is a graph (2) obtained by performing secondary ion mass spectrometry to measure the depth-direction distribution of elements contained in a ferroelectric capacitor manufactured according to the first embodiment.

FIG. 6 is a graph obtained by investigating the distribution of elements different from FIG. 4, in the same comparative example as FIG. 4. FIG. 7 is a graph obtained by carrying out the same investigation as FIG. 6 on the first embodiment.

In the first embodiment illustrated in FIG. 7, a peak is generated in ruthenium (Ru) due to the transition metal oxide material film 34, as indicated by the dotted line B. An edge of the peak extends to the capacitor dielectric film 32a. In contrast, there is no such peak in the comparative example illustrated in FIG. 6.

Thus, it is confirmed that by forming the transition metal oxide material film 34, ruthenium contained in the transition metal oxide material film 34 diffuses into the capacitor dielectric film 32a.

Figure 8:
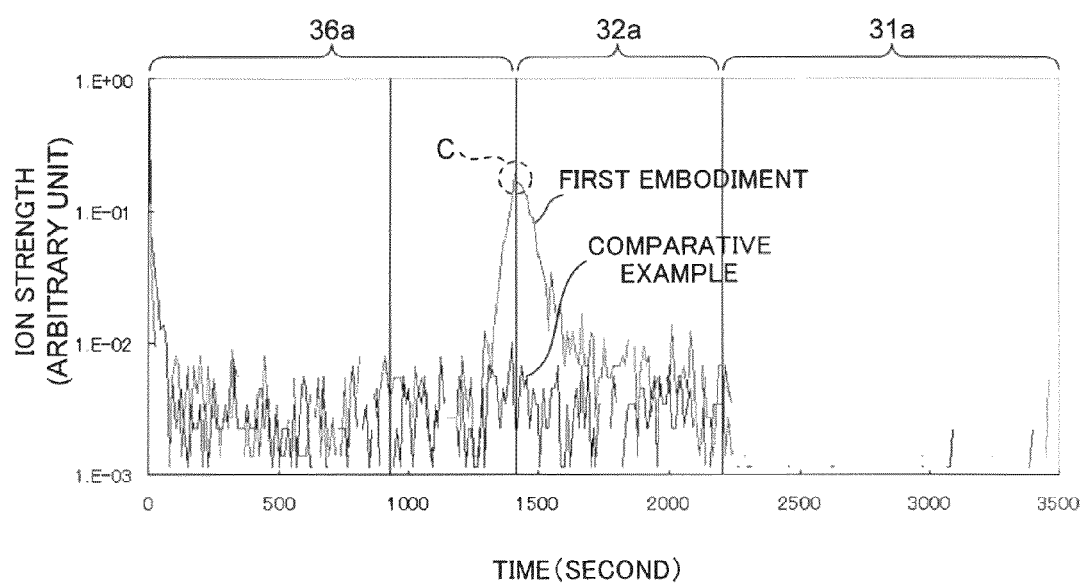
FIG. 8 is a graph obtained by performing secondary ion mass spectrometry to investigate the distribution of ruthenium alone in a ferroelectric capacitor.

FIG. 8 is a graph obtained by performing secondary ion mass spectrometry to investigate the distribution of ruthenium alone in the ferroelectric capacitor Q. Note that the abscissa of this graph has the same meaning as those in FIGS. 4 to 7. The ordinate of the graph indicates the strength of ruthenium ion in arbitrary units.

In addition, FIG. 8 also illustrates the investigation result for the comparative example in which the transition metal oxide material film 34 is not formed.

As indicated by the dotted line C in FIG. 8, in the first embodiment in which the transition metal oxide material film 34 is formed, a distinct peak is generated due to ruthenium contained in the transition metal oxide material film 34, and an edge of the peak extends to the capacitor dielectric film 32a.

Since no such peak is generated in the comparative example, it is confirmed that by forming the transition metal oxide material film 34, ruthenium diffuses into the capacitor dielectric film 32a.

Figure 9:
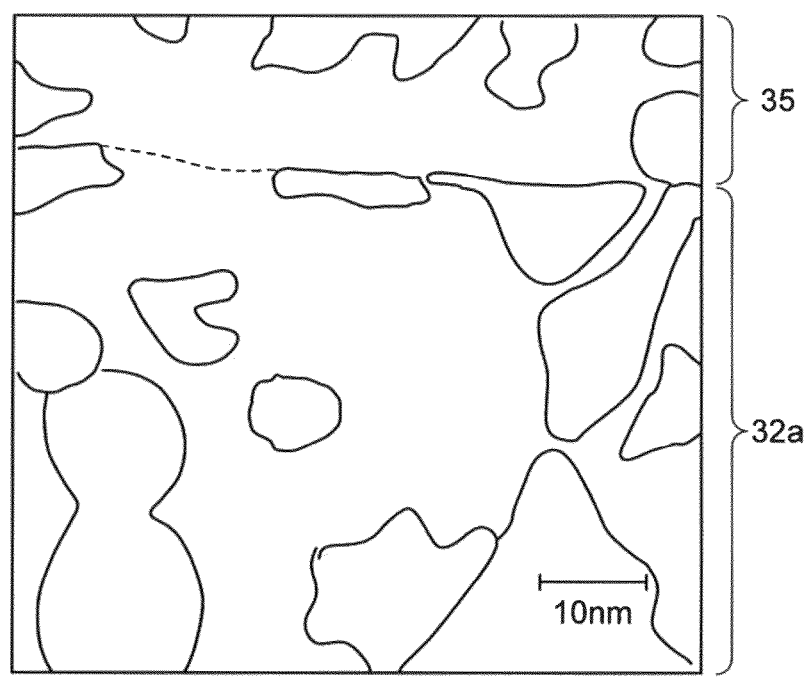
FIG. 9 is a diagram depicted on the basis of an image obtained from observing the vicinity of an interface between a first conductive metal oxide film and a capacitor dielectric film of the ferroelectric capacitor according to the first embodiment, the observation being made with a scanning transmission electron microscope.

FIG. 9 is a diagram depicted on the basis of an image obtained from observing the vicinity of an interface between the first conductive metal oxide film 35 and the capacitor dielectric film 32a of the ferroelectric capacitor Q according to the first embodiment, the observation being made with a Scanning Transmission Electron Microscope (STEM).

Referring to FIG. 9, both of the capacitor dielectric film 32a and the first conductive metal oxide film 35 are crystallized in a columnar shape. The crystal grain sizes are about several tens of nanometers in the capacitor dielectric film 32a, and about 1 nm to 10 nm in the first conductive metal oxide film 35.

Note that the transition metal oxide material film 34 is not observed clearly at the interface between the capacitor dielectric film 32a and the first conductive metal oxide film 35 in FIG. 9.

This is because the transition metal oxide material film 34 is as thin as about 0.5 nm to 3.0 nm, and most of the transition metal oxide material film 34 is incorporated into the second ferroelectric film 33 or the first conductive metal oxide film 35 by crystallization annealing (FIG. 2G).

Further, referring to FIG. 9, it may be confirmed that the entirety of the capacitor dielectric film 32a is crystallized, and no paraelectric layer is formed in the capacitor dielectric film 32a.

Figure 10:
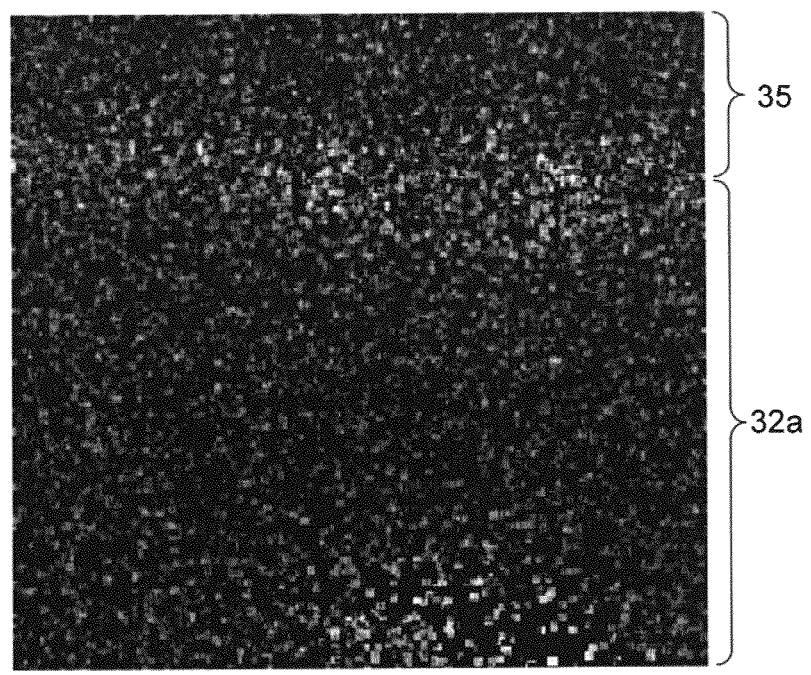
FIG. 10 is a diagram obtained by performing energy dispersive X-ray spectroscopy to investigate the distribution of ruthenium atoms in the same portion as in FIG. 9.

FIG. 10 is a diagram obtained by performing Energy Dispersive X-ray Spectroscopy (EDX) to investigate the distribution of ruthenium atoms in the same portion as in FIG. 9.

As illustrated in FIG. 10, bright points indicating the existence of ruthenium atoms concentrate in the vicinity of the interface between the capacitor dielectric film 32a and the first conductive metal oxide film 35, and it is confirmed that ruthenium from the transition metal oxide material film 34 is left on the interface.

Figure 11:
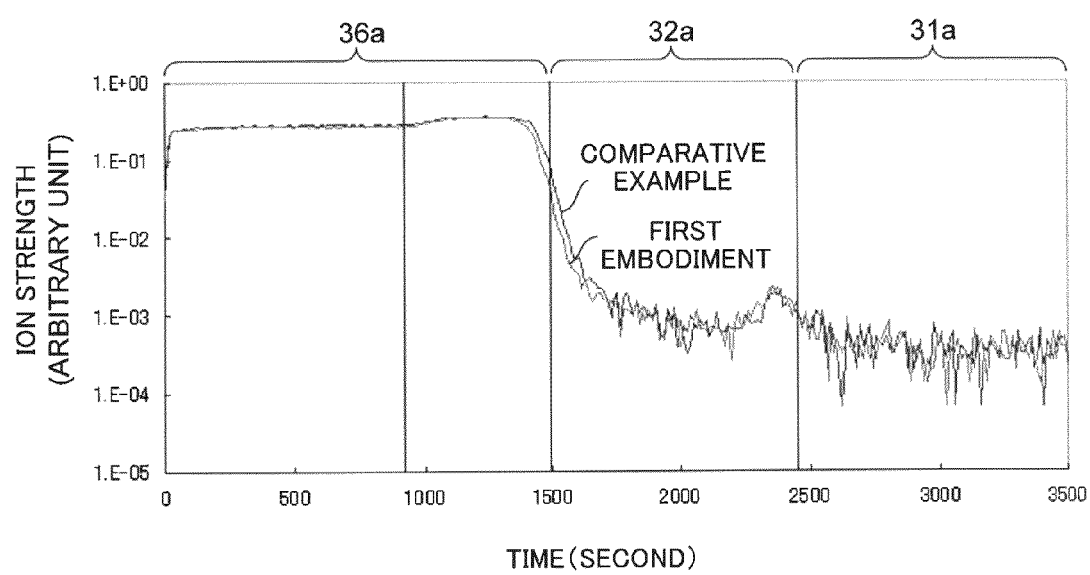
FIG. 11 is a graph obtained by performing secondary ion mass spectrometry to investigate the distribution of iridium alone in the ferroelectric capacitor.

FIG. 11 is a graph obtained by performing secondary ion mass spectrometry to investigate the distribution of iridium alone in the ferroelectric capacitor Q. Note that the abscissa and ordinate of this graph have the same meaning as those in FIG. 8.

Additionally, FIG. 11 also illustrates the investigation result for the comparative example in which the transition metal oxide material film 34 is not formed.

As illustrated in FIG. 11, the graph of the first embodiment is slightly shifted to the left as compared to that of the comparative example. With this result, it is confirmed that the transition metal oxide material film 34 has a function of suppressing diffusion of iridium from the first conductive metal oxide film 35 into the second ferroelectric film 33 to some extent.

As described above, according to the investigation results illustrated in FIGS. 6 to 8, 10 and 11, it may be confirmed that iridium and ruthenium are contained in the capacitor dielectric film 32a according to the first embodiment.

Figure 12:
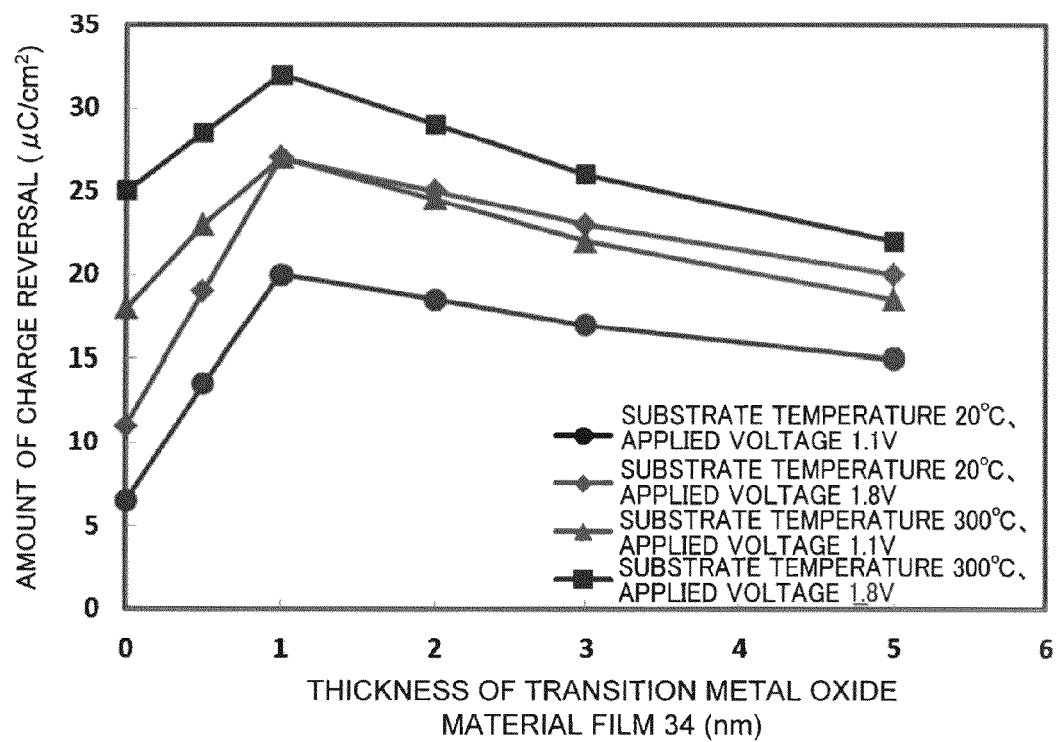
FIG. 12 is a graph obtained by investigating the amount of charge reversal in the ferroelectric capacitor according to the first embodiment.

FIG. 12 is a graph obtained by investigating the amount of charge reversal in the ferroelectric capacitor Q according to the first embodiment. The abscissa of this graph indicates the thickness of the transition metal oxide material film 34, and the ordinate thereof indicates the amount of charge reversal.

In this investigation, the first ferroelectric film 32 is formed with 70 nm thickness, and the second ferroelectric film 33 is formed with 10 nm thickness.

Then, a plurality of samples including transition metal oxide material films 34 of different thicknesses in a range of 0 nm to 5 nm are manufactured. The substrate temperature at the time of forming the transition metal oxide material films 34 is set to 60° C.

Note that in this investigation, evaluations are also made for a case where an amorphous first conductive metal oxide film 35 is formed by setting the substrate temperature at the time of forming the first conductive metal oxide film 35 to room temperature (20° C.), and a case where this substrate temperature is set to 300° C. Further, an investigation is carried out on each of cases where a voltage applied between the bottom electrode 31a and the top electrode 36a of the capacitor Q is 1.1V and where it is 1.8V.

As is clear from FIG. 12, the amount of charge reversal is minimized in all four of the graphs when the transition metal oxide material film 34 is not formed (0 nm thickness). With this result, it is confirmed that forming the transition metal oxide material film 34 is effective for increasing the amount of charge reversal in the ferroelectric capacitor Q.

Further, in the same case of forming the transition metal oxide material film 34, it is made clear that the amount of charge reversal is increased even more if the substrate temperature at the time of forming the first conductive metal oxide film 35 is set to 300° C., as compared to a case where the substrate temperature is set to room temperature (20° C.).

This is because when the first conductive metal oxide film 35 is formed at a high substrate temperature of 300° C., crystal grains of the iridium oxide in the first conductive metal oxide film 35 become even, which prevents an amorphous layer from being formed in the capacitor dielectric film 32a.

Meanwhile, in all four of the graphs, the amount of charge reversal is maximized when the thickness of the transition metal oxide material film 34 is 1 nm. In addition, when the thickness of the transition metal oxide material film 34 exceeds 3 nm, the amount of charge reversal is decreased to about the same amount as when the transition metal oxide material film 34 is not formed.

Accordingly, it is also preferable to form the transition metal oxide material film 34 in about 0.5 nm to 3.0 nm thickness to maintain a large amount of charge reversal.

Figure 13:
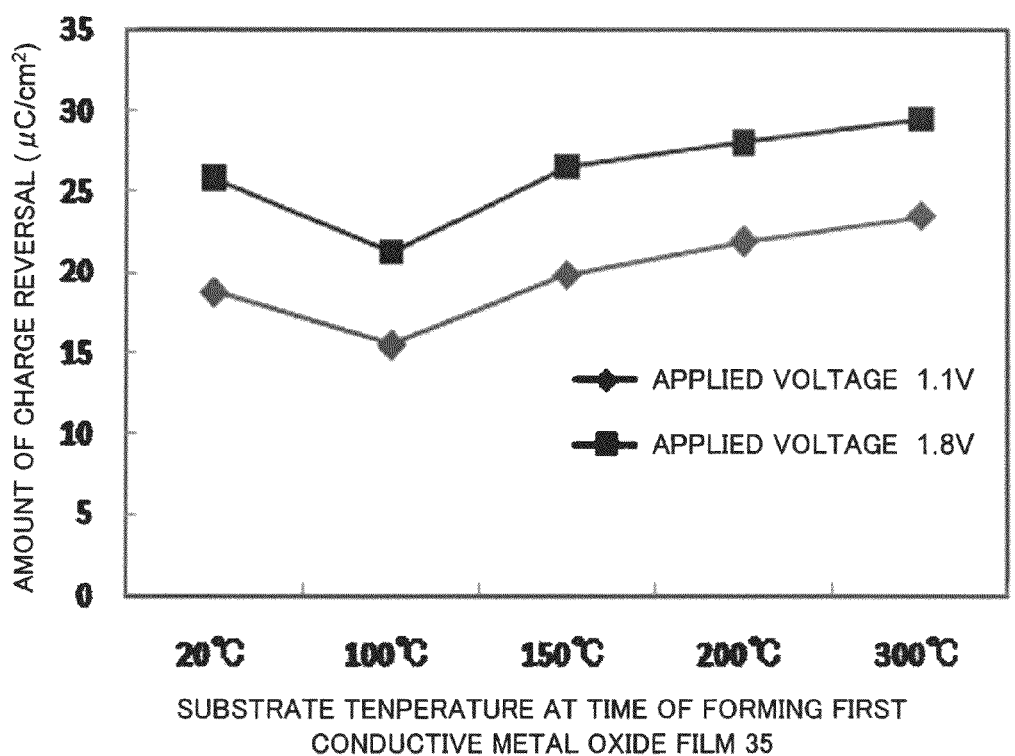
FIG. 13 is a graph obtained by investigating a relationship between a substrate temperature at the time of forming the first conductive metal oxide film and the amount of charge reversal in the ferroelectric capacitor in the first embodiment.

FIG. 13 is a graph obtained by investigating a relationship between a substrate temperature at the time of forming the first conductive metal oxide film 35 and the amount of charge reversal in the ferroelectric capacitor Q.

Note that in this investigation, the first ferroelectric film 32 is formed with 70 nm thickness, and the second ferroelectric film 33 is formed with 10 nm thickness. Additionally, the transition metal oxide material film 34 is formed with 2 nm thickness. Then, an investigation is carried out on each of cases where a voltage applied between the bottom electrode 31a and the top electrode 36a of the ferroelectric capacitor Q is 1.1V and where it is 1.8V.

As illustrated in FIG. 13, the amount of charge reversal is minimized for both of the voltages when the substrate temperature is 100° C. This is because the first conductive metal oxide film 35 formed at the substrate temperature of 100° C. is not fully crystallized, and thus has an unstable film quality.

Meanwhile, the amount of charge reversal is increased when the substrate temperature is 150° C. or higher. This is because the first conductive metal oxide film 35 is fully crystallized at the time of forming the film.

With this result, it is made clear that the substrate temperature at the time of forming the first conductive metal oxide film 35 is preferably set to 150° C. or higher. In addition, it is preferable that the maximum substrate temperature be set to 350° C. to prevent abnormal growth of the iridium oxide in the first conductive metal oxide film 35, as mentioned above.

Figure 14:
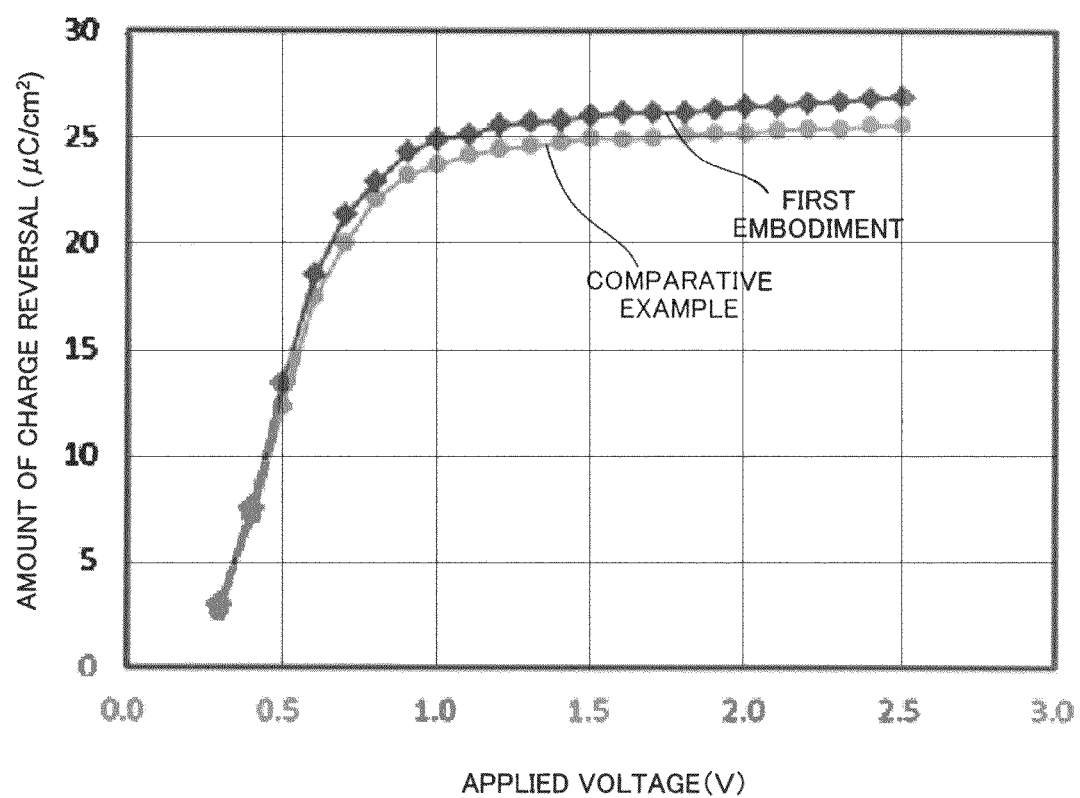
FIG. 14 is a graph obtained by investigating a relationship between voltages applied to the ferroelectric capacitor and the amount of charge reversal in the ferroelectric capacitor, in each of the first embodiment and in the comparative example.

FIG. 14 is a graph obtained by investigating a relationship between voltages applied to the ferroelectric capacitor Q and the amount of charge reversal in the ferroelectric capacitor Q. The amount of charge reversal is measured by setting the temperature of the ferroelectric capacitor Q to 25° C.

Note that in this investigation, an evaluation is also made for a ferroelectric capacitor Q according to a comparative example in which the transition metal oxide material film 34 is not formed. In addition, in the ferroelectric capacitor Q according to the first embodiment, the transition metal oxide material film 34 is formed with 1 nm thickness.

As illustrated in FIG. 14, the amount of charge reversal is larger in the first embodiment than in the comparative example at any applied voltage.

Figure 15:
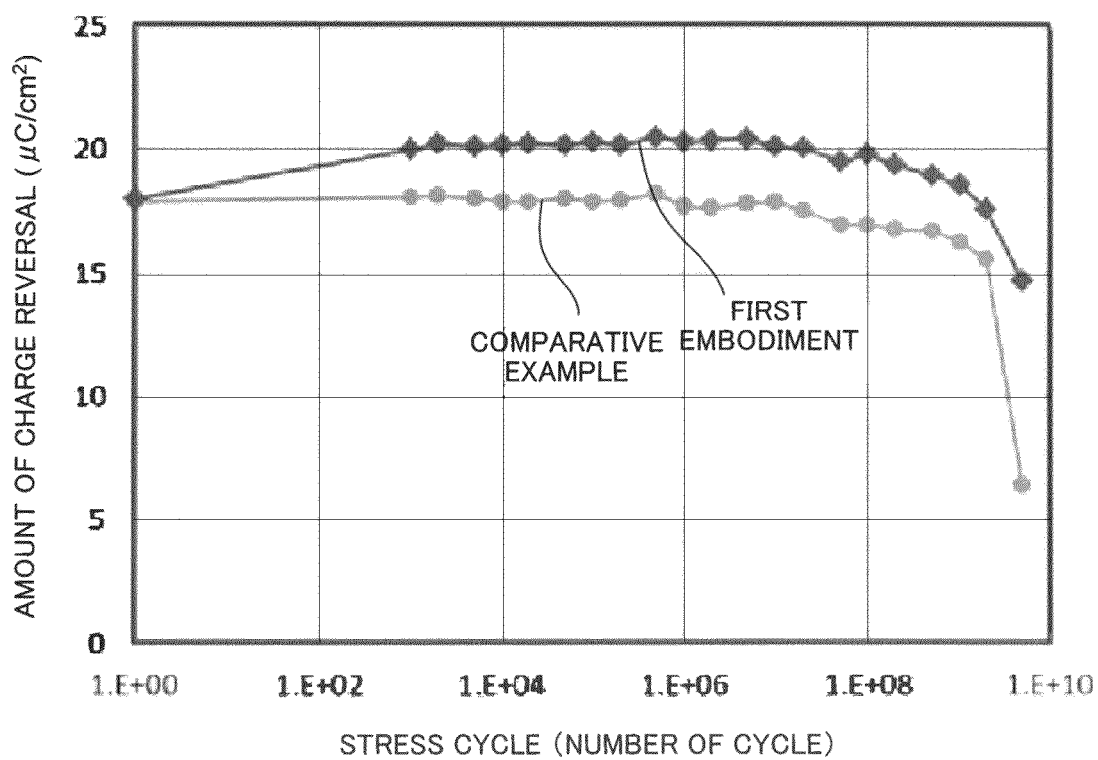
FIG. 15 is a graph obtained by investigating a fatigue characteristic of the ferroelectric capacitor in each of the first embodiment and in the comparative example.

With this result, it may be confirmed that forming the transition metal oxide material film 34 is effective in increasing the amount of charge reversal, irrespective of the magnitude of the applied voltage FIG. 15 is a graph obtained by investigating a fatigue characteristic of the ferroelectric capacitor Q in each of the first embodiment and in the comparative example, the two ferroelectric capacitors Q being used in the investigation in FIG. 14.

In FIG. 15, the abscissa indicates stress cycles, and the ordinate indicates the amount of charge reversal in the ferroelectric capacitor Q. A stress cycle refers to the number of times which an accelerating voltage is applied to the ferroelectric capacitor Q to reverse the polarization of the capacitor dielectric film 32a. In this investigation, the measured temperature is 90° C., the accelerating voltage is 5V, and the measured voltage at the time of reading the amount of charge reversal is 1.8V.

As illustrated in FIG. 15, the amount of charge reversal is larger in the first embodiment than in the comparative example, at any stress cycle.

In particular, while the amount of charge reversal decreases significantly after the passage of a $5 \times 10^9$ cycle, the decrease in the first embodiment is not as significant as in the comparative example.

With this result, it is made clear that forming the transition metal oxide material film 34 as in the first embodiment decreases the fatigue of the ferroelectric capacitor Q, and elongates the life of the ferroelectric capacitor Q.

Figure 16:
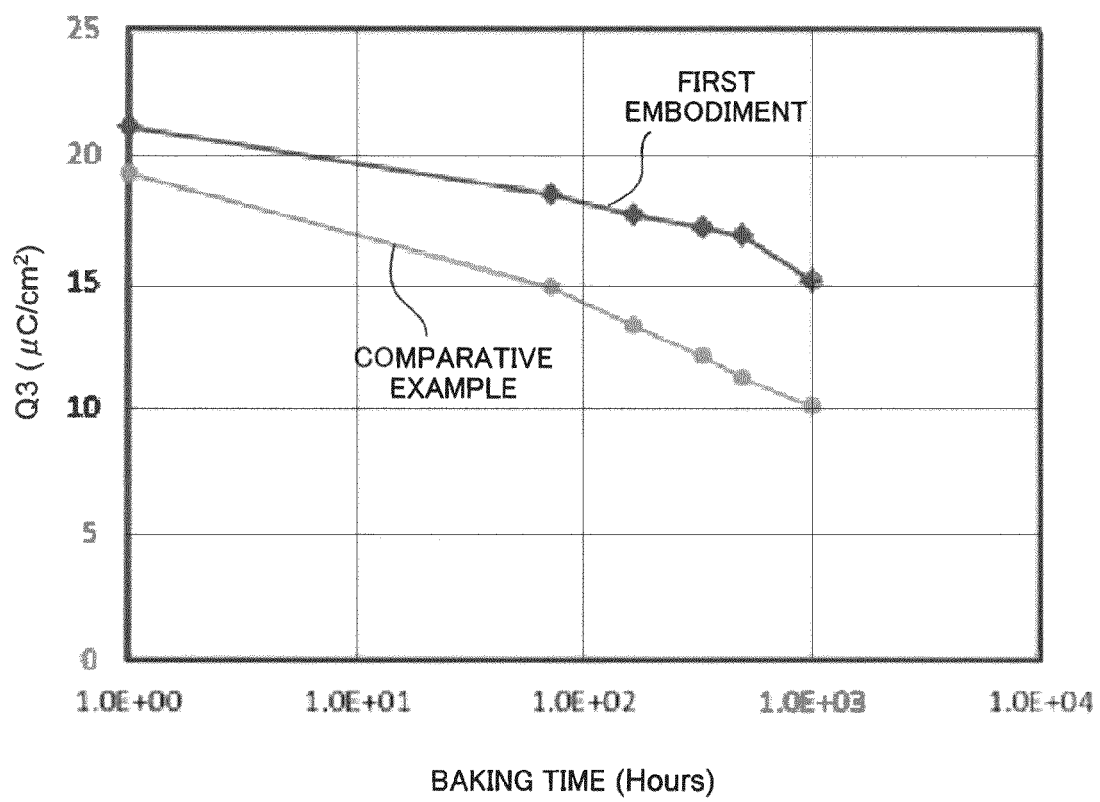
FIG. 16 is a graph obtained by investigating an imprint characteristic of the ferroelectric capacitor in each of the first embodiment and in the comparative example.

FIG. 16 is a graph obtained by investigating an imprint characteristic of the ferroelectric capacitor Q. In the investigation, the imprint characteristic of the ferroelectric capacitor Q according to the comparative example in which the transition metal oxide material film 34 is not formed is also measured for comparison.

Note that imprint refers to a phenomenon in which data written to the ferroelectric capacitor Q is fixed, and is not reversed easily. In this investigation, the imprint characteristic is measured by a Q123 test.

In the Q123 test, the ferroelectric capacitor Q is formed as a cell capacitor of a 2T2C memory. The neighboring two cell capacitors are expressed as Cap-A and Cap-B below. In the test, data is written to each of the capacitors so that Cap-A and Cap-B may have opposite polarizations.

Firstly, data "0" is written to Cap-A and Cap-B at +1.8V and −1.8V, respectively, and the capacitors are baked at 150° C. for acceleration. No voltage is applied to Cap-A or Cap-B while they are baked. Then, at each of time points where the capacitors have been baked for 72, 168, 334, 504, and 1008 hours, each of Cap-A and Cap-B is applied a +1.8V pulse to read data. The difference between the amount of polarization changes of Cap-A and Cap-B is defined as Q2.

After measuring Q2, data "1" which is opposite from the data written before baking is written to each of Cap-A and Cap-B. In this example, the data is written by applying a −1.8V pulse to Cap-A and a +1.8V pulse to Cap-B, and resting them for 30 seconds.

With a severe imprint failure, the capacitor Q attempts to restore the original level of polarization, which causes a large depolarization. After resting the capacitors Q for 30 seconds, a +1.8V pulse is applied thereto to read data "1", and the difference between the amount of polarization changes of Cap-A and Cap-B measured from the reading is defined as Q3.

Q3 indicates the remaining amount of polarization after the depolarization due to imprint. This is an index as to whether data may be read from cap-A or Cap-B.

In FIG. 16, the ordinate indicates values of Q3, and the abscissa indicates the aforementioned bake time.

As illustrated in FIG. 16, the inclination of the graph of the first embodiment is not as steep as the comparative example. This indicates that data is less likely to be fixed in the ferroelectric capacitor Q according to the first embodiment, and that the ferroelectric capacitor Q according to the first embodiment has a better imprint characteristic. Accordingly, it is made clear that forming the transition metal oxide material film 34 as in the first embodiment also facilitates improvement in the imprint characteristic.

Figure 17:
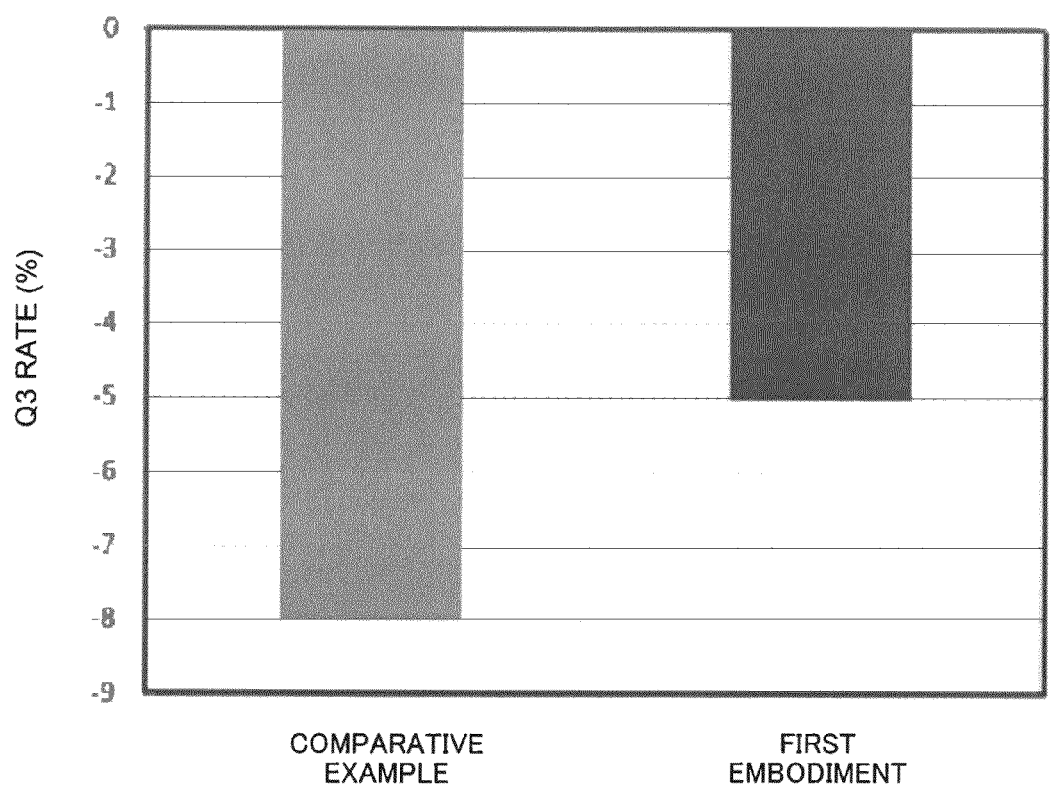
FIG. 17 is a graph obtained by calculating a Q3 rate of the ferroelectric capacitor in each of the first embodiment and in the comparative example.

FIG. 17 is a graph obtained by calculating a Q3 rate of the ferroelectric capacitor Q in each of the first embodiment and in the comparative example used in FIG. 16.

A Q3 rate is defined as the inclination of the graph in FIG. 16. Since the amount of polarization left in the ferroelectric capacitor decreases with time, the Q3 rate takes a negative value. The smaller the absolute value of the Q3 rate, the larger the polarization left in the ferroelectric capacitor, which indicates a good imprint characteristic of the ferroelectric capacitor.

As illustrated in FIG. 17, the first embodiment has a smaller absolute value of Q3 rate than the comparative example in which the transition metal oxide material film 34 is not formed, and thus it is confirmed that the imprint characteristic is improved in the first embodiment.

Figure 18:
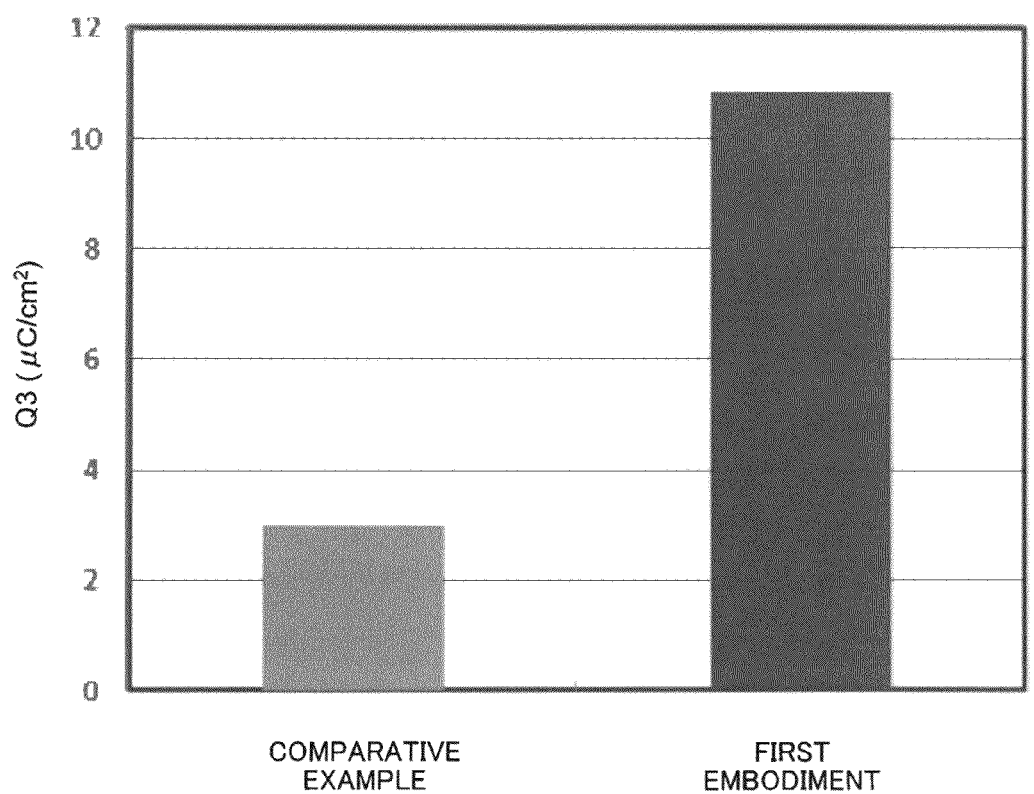
FIG. 18 is a graph illustrating probable Q3 values in a case where the bake time is $50 \times 10^3$ hours in FIG. 16.

FIG. 18 is a graph illustrating probable Q3 values in a case where the bake time in FIG. 16 is $50 \times 10^3$ hours in FIG. 16

As illustrated in FIG. 18, Q3 of the first embodiment is largely increased as compared to the comparative example, and thus it is confirmed that the imprint characteristic of the ferroelectric capacitor Q is improved.

With the above results illustrated in FIGS. 12 to 18, it is confirmed that forming the transition metal oxide material film 34 improves the amount of charge reversal and imprint characteristic of the ferroelectric capacitor Q, and enhances the characteristic of the semiconductor device including the ferroelectric capacitor Q.

Second Embodiment

In the above first embodiment, the transition metal oxide material film 34 (see FIG. 2E) is formed to improve electrical characteristics of the ferroelectric capacitor Q such as the amount of charge reversal and imprint characteristic.

In the second embodiment, a description is given of a method for improving the electrical characteristics of a ferroelectric capacitor Q without forming such a transition metal oxide material film 34.

FIGS. 19A to 19E illustrate in sectional views a semiconductor device according to the second embodiment in the course of manufacturing. Note that components in FIGS. 19A to 19E which are the same as those described in the first embodiment are assigned the same reference numerals as in the first embodiment, and descriptions thereof are omitted in the following description.

In addition, as in the case of the first embodiment, a planar FeRAM is manufactured as a semiconductor device in the second embodiment.

Figure 19A:
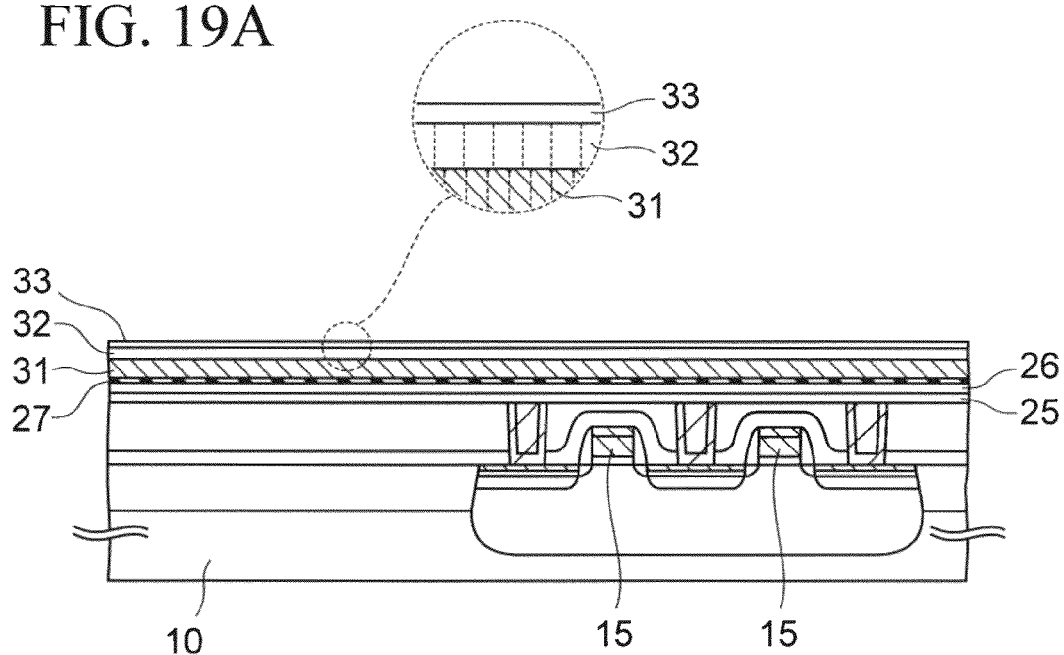
FIGS. 19A to 19E illustrate in sectional views a semiconductor device according to a second embodiment in the course of manufacturing.

Firstly, a description is given of processes for obtaining the cross section structure illustrated in FIG. 19A.

At first, assume that the processes of the first embodiment illustrated in FIGS. 2A to 2C are performed to form a crystallized first ferroelectric film 32 on an entire top surface of a silicon substrate 10.

Thereafter, a PZT film to which calcium, strontium, and lanthanum are added is formed to serve as a second ferroelectric film 33, by RF sputtering using a CSPLZT target.

In the second embodiment, iridium and ruthenium are previously added to the above CSPLZT target, so that the second ferroelectric film 33 is further added with iridium and ruthenium at the time of forming the film.

The thickness of the second ferroelectric film 33 is not particularly limited. Note, however, that as described in the first embodiment, it is preferable that the second ferroelectric film 33 be formed as thin as possible to prevent deterioration in the crystallizability of the second ferroelectric film 33, as well as to prevent lowering in the electric field strength to be applied to the second ferroelectric film 33. In the second embodiment, the second ferroelectric film 33 is formed with a thickness of about 5 nm to 20 nm, such as 10 nm to 15 nm.

In addition, the second ferroelectric film 33 formed by sputtering is not crystallized but is in an amorphous state, and thus there are no distinct crystal grain boundaries in the second ferroelectric film 33, as depicted in the dotted circle.

The amorphous second ferroelectric film 33 is later crystallized by crystallization annealing. In order that the second ferroelectric film 33 may take over the crystal of the underlying first ferroelectric film 32, it is preferable that the second ferroelectric film 33 be formed with a material which has the same crystal structure as the first ferroelectric film 32 when crystallized.

For example, when the first ferroelectric film 32 is an $ABO_3$ type ferroelectric oxide, an $ABO_3$ type ferroelectric oxide of the same material is preferably used as the material of the second ferroelectric film 33.

Figure 19B:
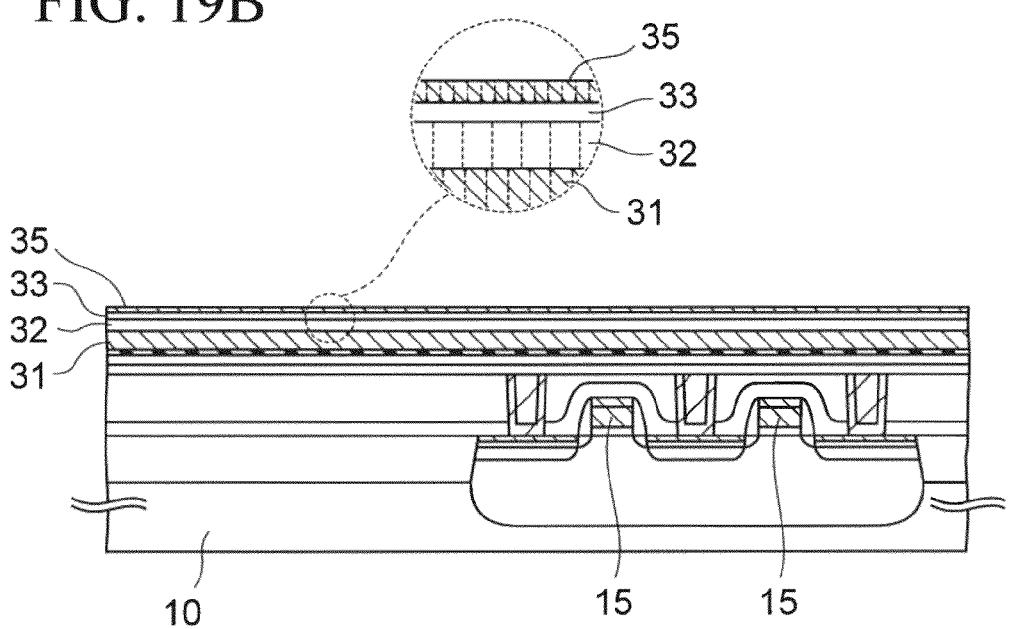

Next, as illustrated in FIG. 19B, the same film-forming conditions as the first embodiment are used to form an iridium oxide film to serve as a first conductive metal oxide film 35 on the second ferroelectric film 33. The thickness of the iridium oxide film is preferably about 10 nm to 70 nm, for example, more preferably about 20 nm to 50 nm, or more preferably about 25 nm, as described in the first embodiment.

Figure 19C:
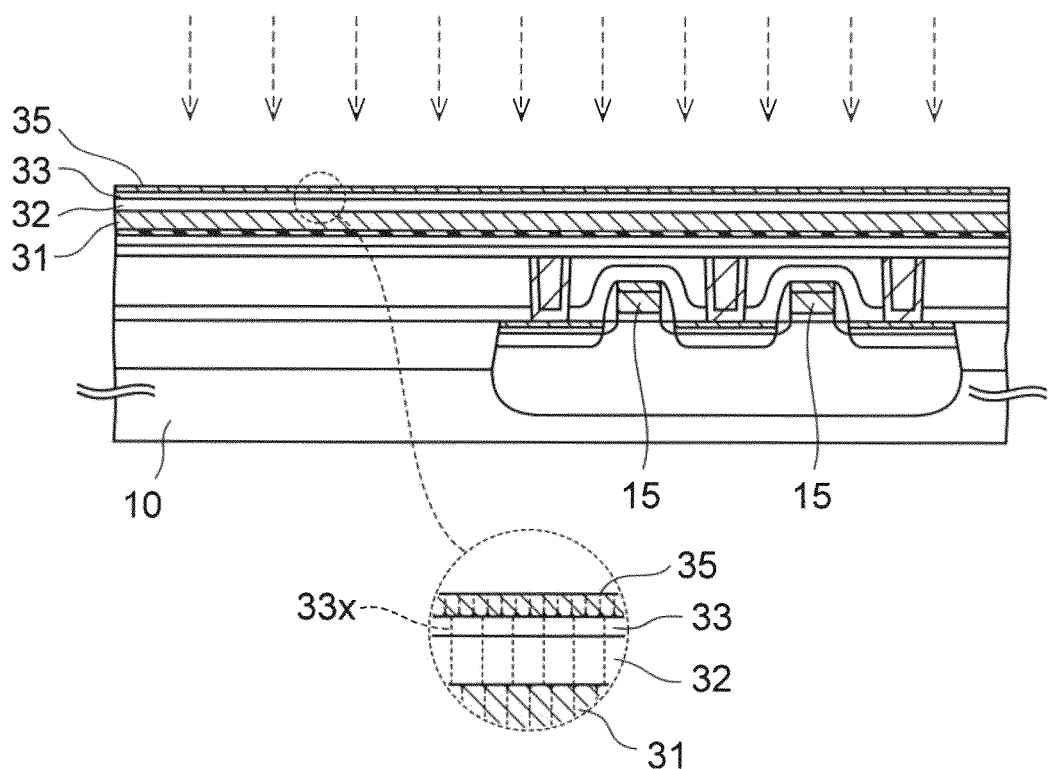

Next, as illustrated in FIG. 19C, RTA is performed for approximately 120 seconds in a mixed atmosphere including argon gas and oxygen gas as crystallization annealing on the amorphous second ferroelectric film 33. With this, the second ferroelectric film 33 is crystallized, and PZT crystal grain boundaries 33x appear in the film.

After the crystallization, in the second ferroelectric film 33, the B site of PZT having an $ABO_3$ type perovskite structure is replaced with ruthenium or iridium previously added to the second ferroelectric film 33, and thus ruthenium and iridium are incorporated into the crystal of PZT.

Accordingly, there is no room for ruthenium or iridium to thermally diffuse into the second ferroelectric film 33. Hence, it may be possible to prevent iridium in the first conductive metal oxide film 35 from thermally diffusing into the second ferroelectric film 33 due to heat from this crystallization annealing or following annealing processes. As a result, it may be possible to reduce fear of a paraelectric layer to be formed in the second ferroelectric film 33, the paraelectric layer being formed because of thermally diffused iridium.

Note that conditions for this crystallization annealing are not particularly limited. In the second embodiment, as in the case of the first embodiment, this crystallization annealing is performed by setting the substrate temperature to 700° C. to 750° C., the flow rate of argon gas to 1500 sccm to 3000 sccm, and the flow amount of oxygen gas to 10 sccm to 100 sccm.

Figure 19D:
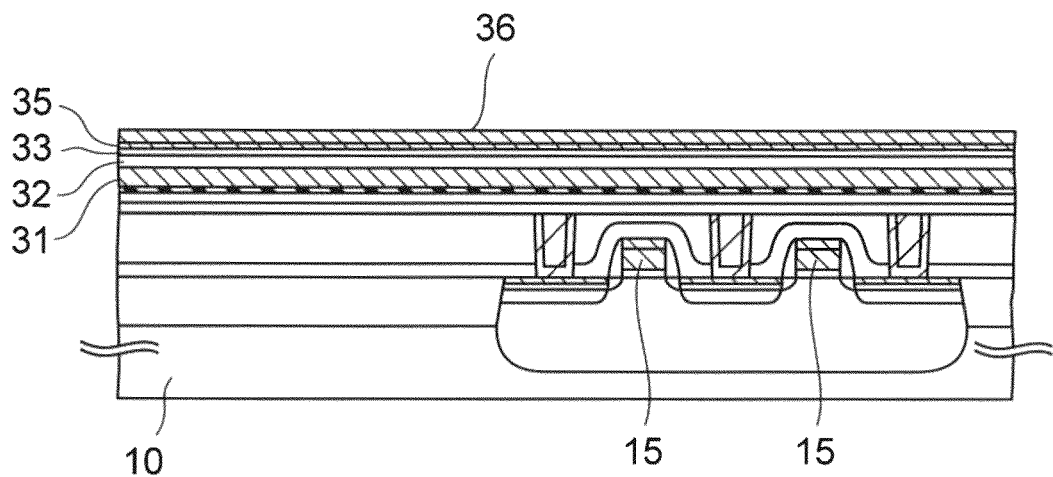

Next, as illustrated in FIG. 19D, the same film-forming conditions as the first embodiment are used to form an iridium oxide film with a thickness of about 70 nm to 200 nm, such as 150 nm, to serve as a second conductive metal oxide film 36 on the first conductive metal oxide film 35 by reactive sputtering.

As described in the first embodiment, it is preferable that the composition ratio of oxygen in the second conductive metal oxide film 36 be made larger than that in the first conductive metal oxide film 35, by increasing a flow rate of oxygen gas in the sputtering gas as compared to the time of forming the first conductive metal oxide film 35.

Figure 19E:
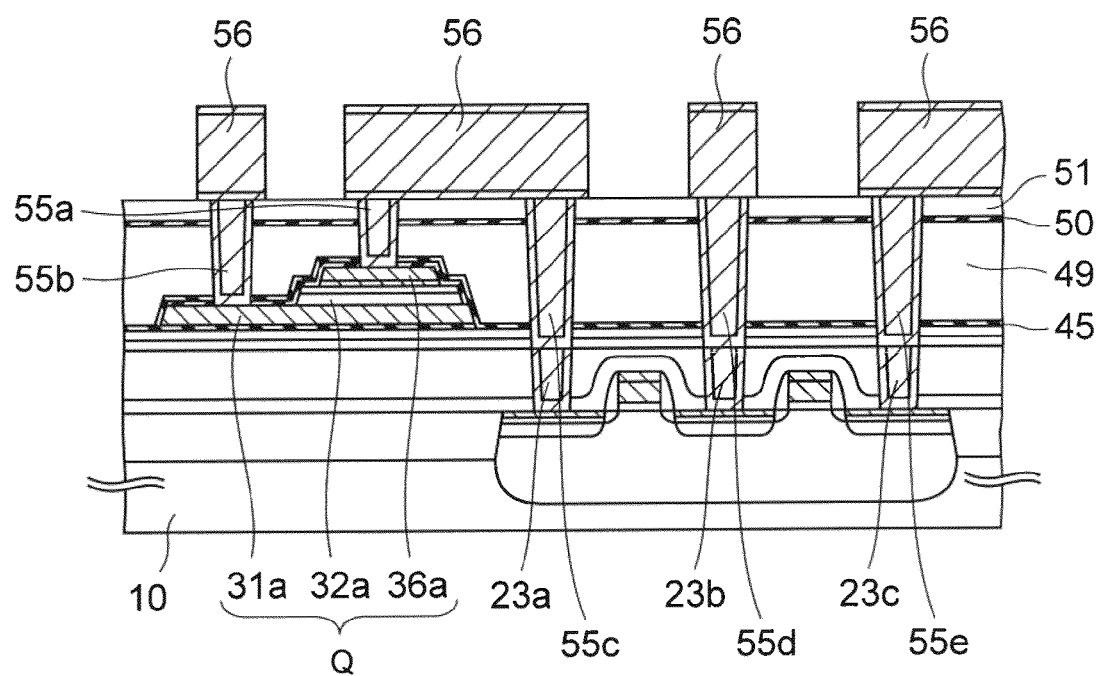

Thereafter, the processes of the first embodiment illustrated in FIGS. 2I to 2W are performed to complete the basic structure of the semiconductor device including the ferroelectric capacitor Q as illustrated in FIG. 19E.

According to the second embodiment described above, since ruthenium is added to the second ferroelectric film 33 at the time of forming the film, there is no need to form a transition metal oxide material film 34 (see FIG. 2E) for causing ruthenium to thermally diffuse into the second ferroelectric film 33. Hence, number of processes is decreased as compared to the first embodiment.

Further, because ruthenium and iridium are added to the second ferroelectric film 33 at the time of forming the film, there is no room in the second ferroelectric film 33 for any more iridium to thermally diffuse therein from the first conductive metal oxide material film 35. Accordingly, it may be possible to prevent a paraelectric layer due to iridium from being formed in the second ferroelectric film 33.

As a result, as in the case of the first embodiment, it may be possible to increase the amount of charge reversal and enhance the imprint characteristic in the ferroelectric capacitor Q.

Third Embodiment

A planar FeRAM is manufactured as a semiconductor device in the first and second embodiments. Meanwhile, a stack FeRAM being more advantageous in size reduction than a planar FeRAM is manufactured as a semiconductor device in a third embodiment.

Figure 20A:
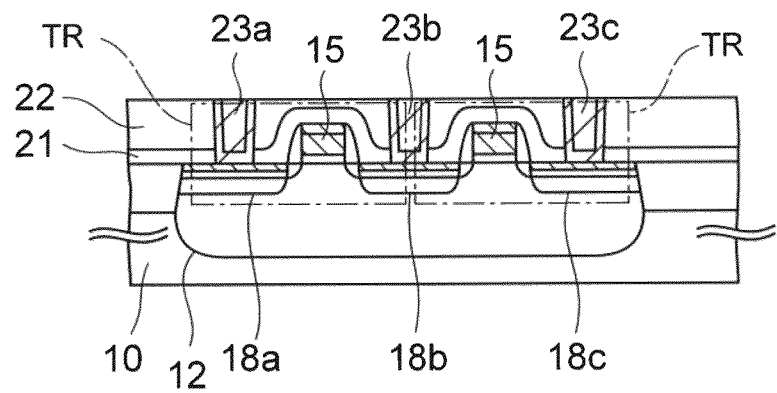
FIGS. 20A to 20R illustrate in sectional views a semiconductor device according to a third embodiment in the course of manufacturing.
Figure 20B:
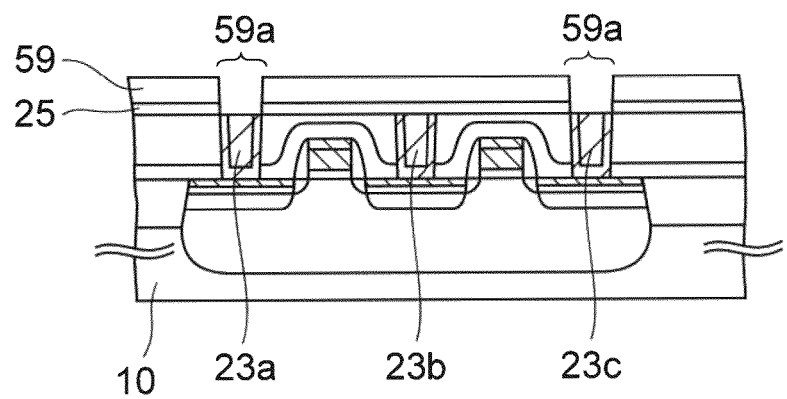
Figure 20C:
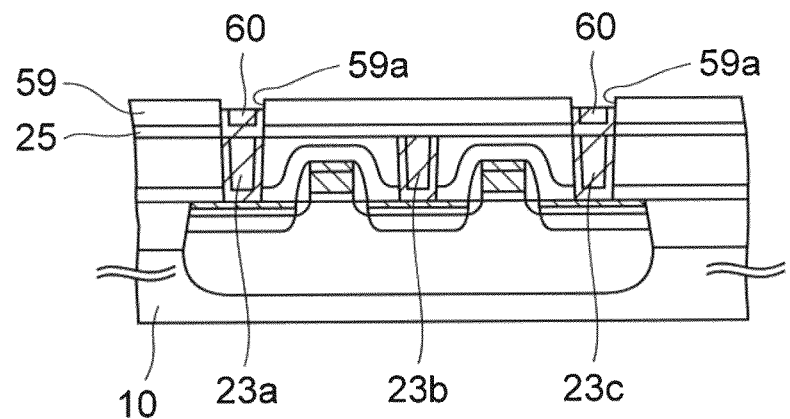
Figure 20D:
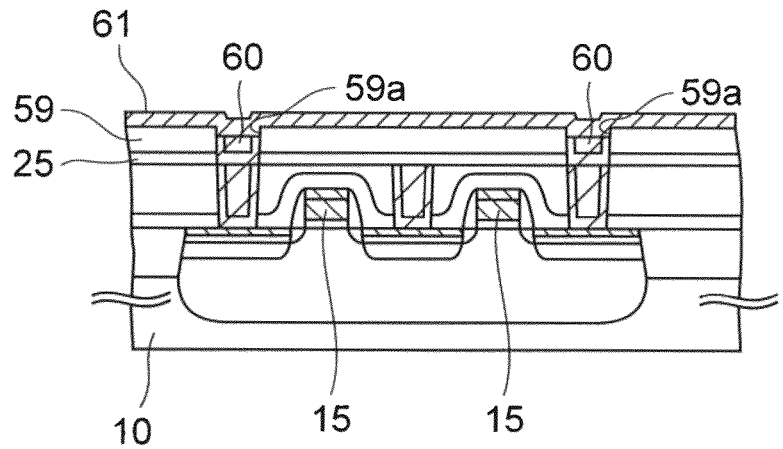
Figure 20E:
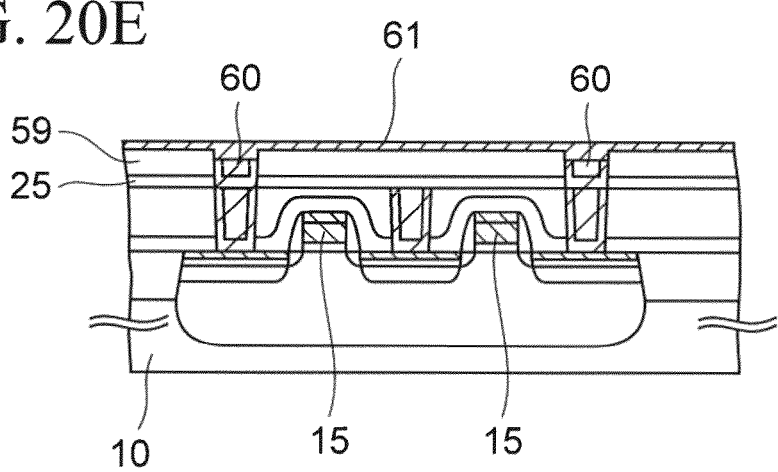
Figure 20F:
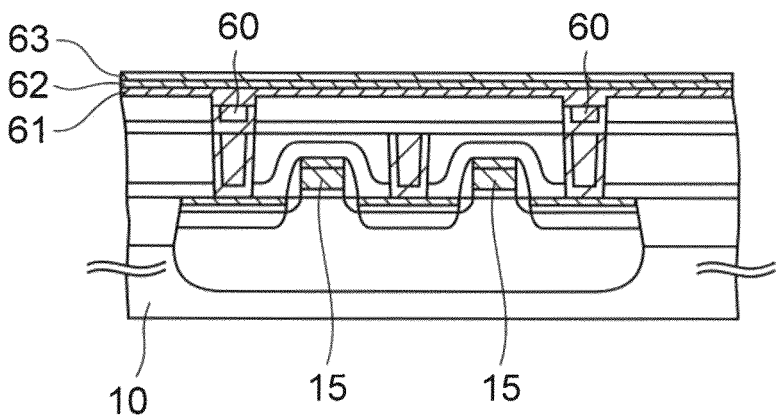
Figure 20G:
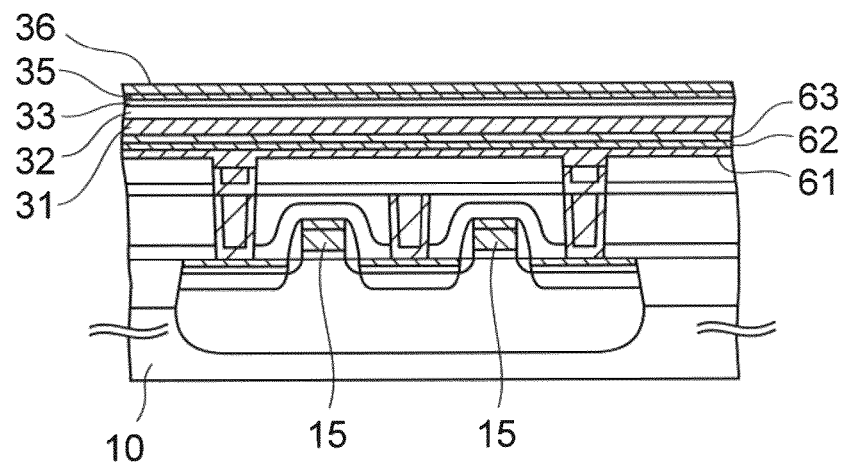
Figure 20H:
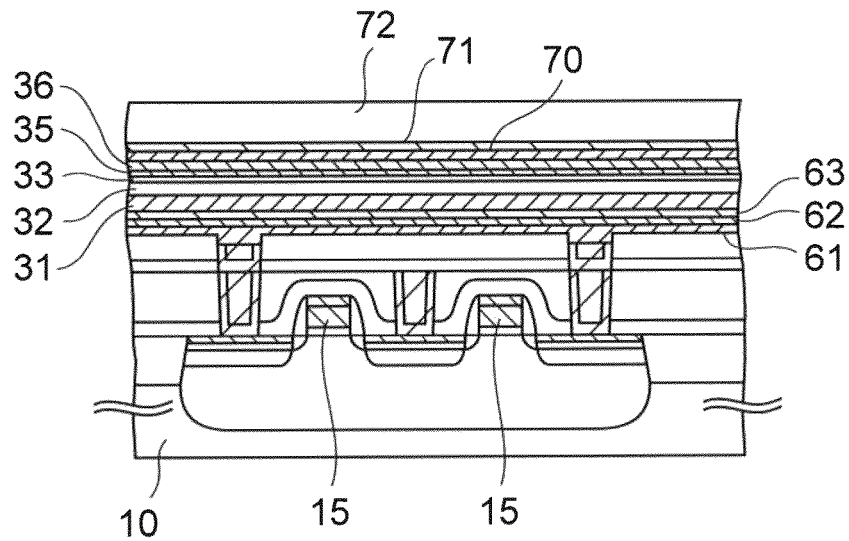
Figure 20I:
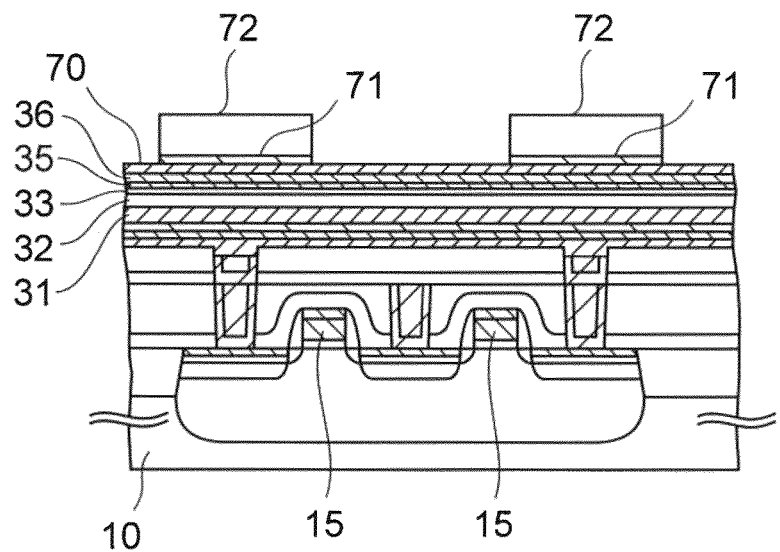
Figure 20J:
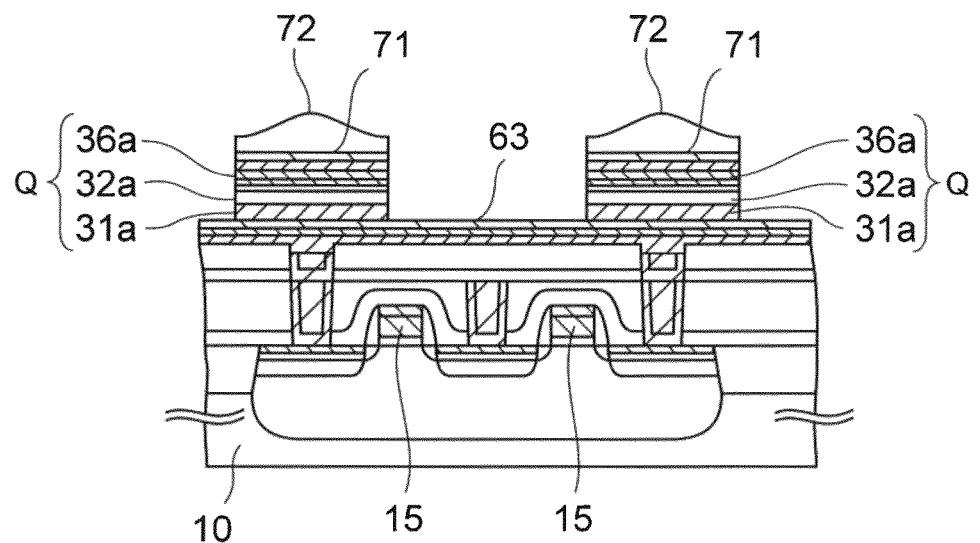
Figure 20K:
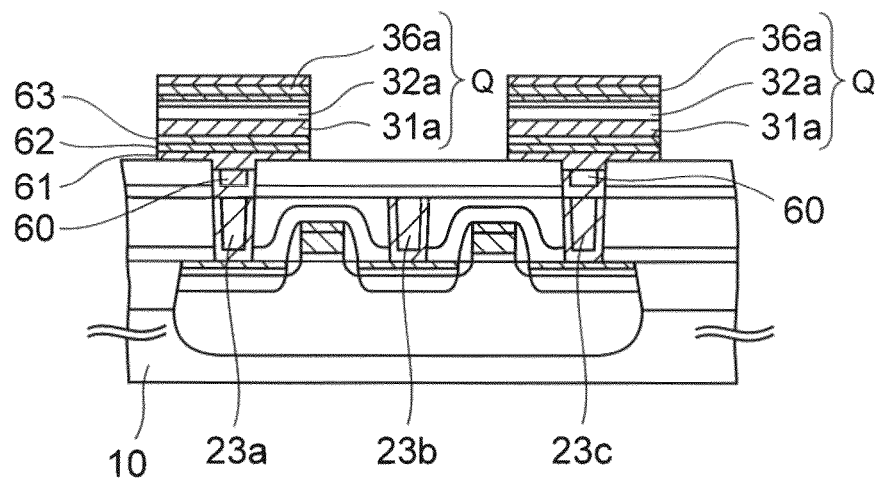
Figure 20L:
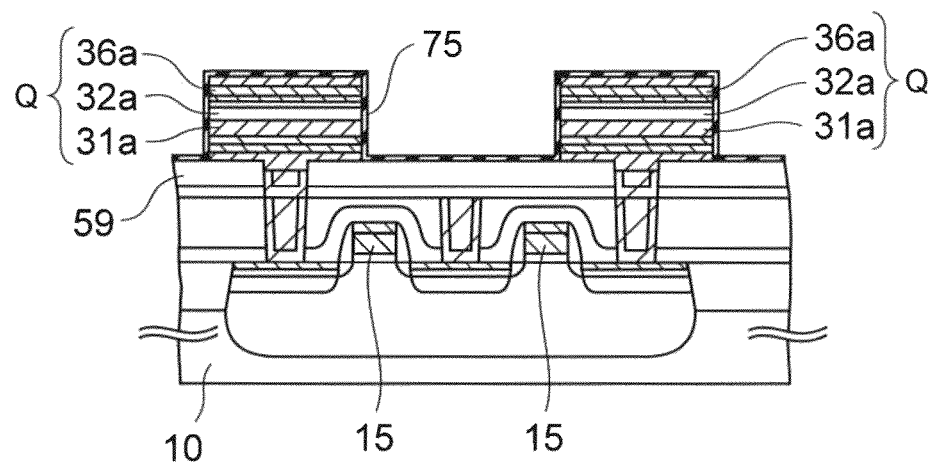
Figure 20M:
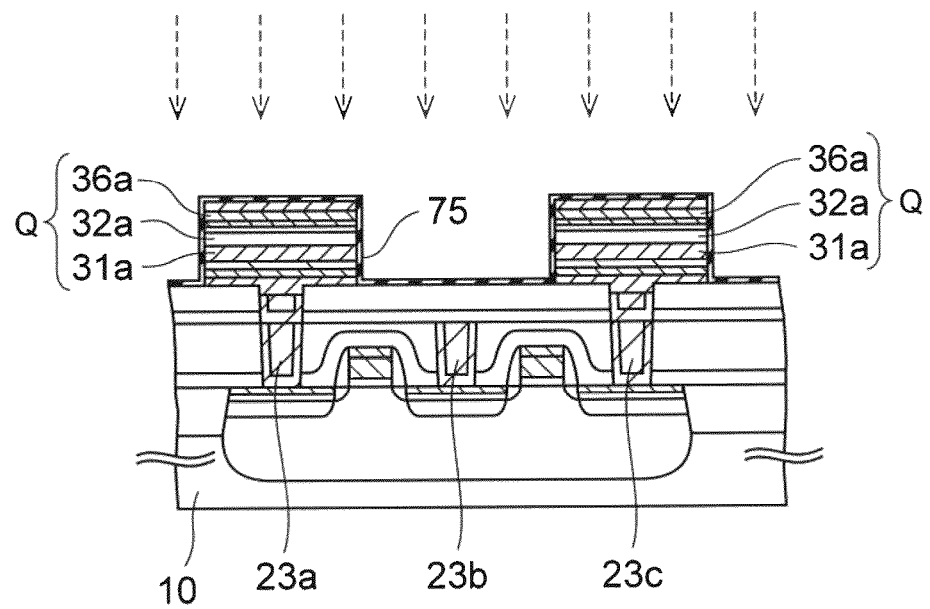
Figure 20N:
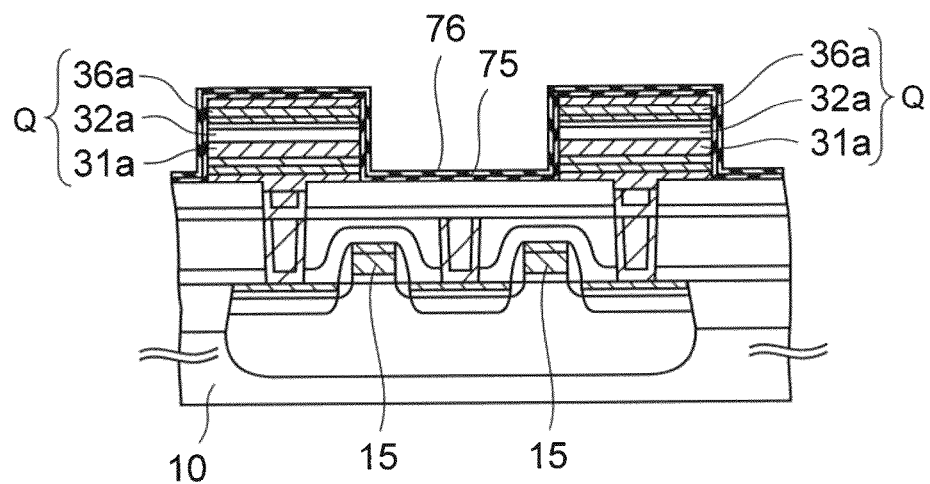
Figure 20O:
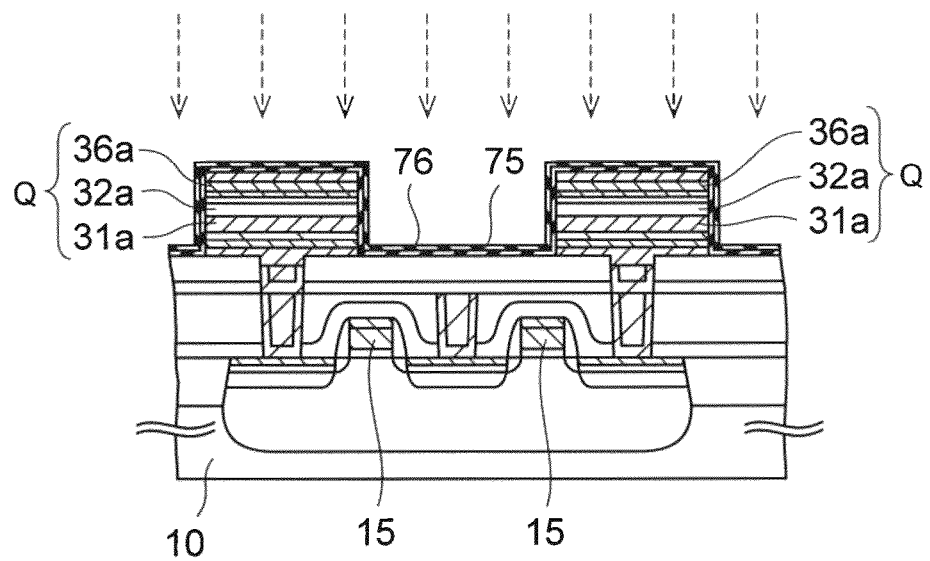
Figure 20P:
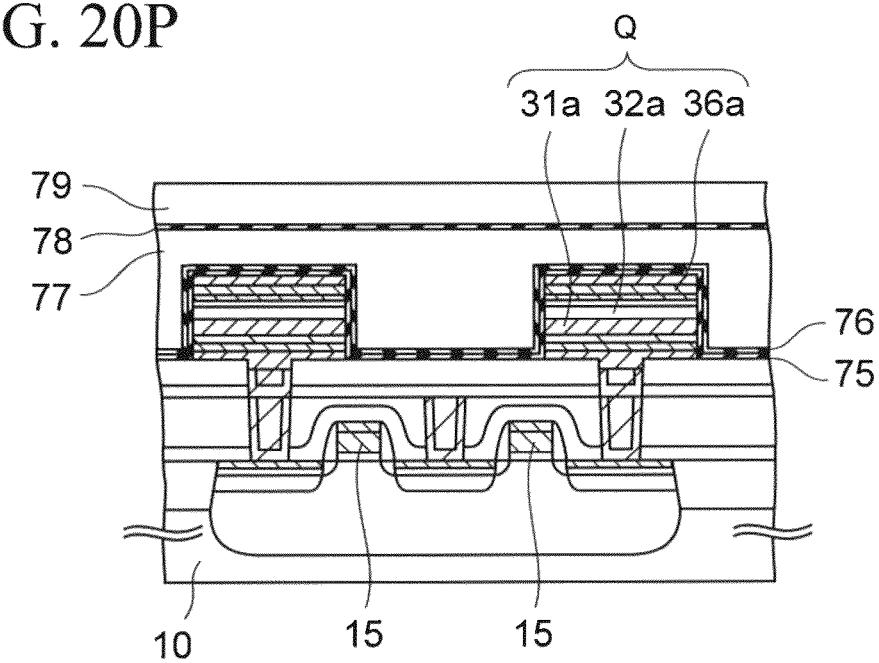
Figure 20Q:
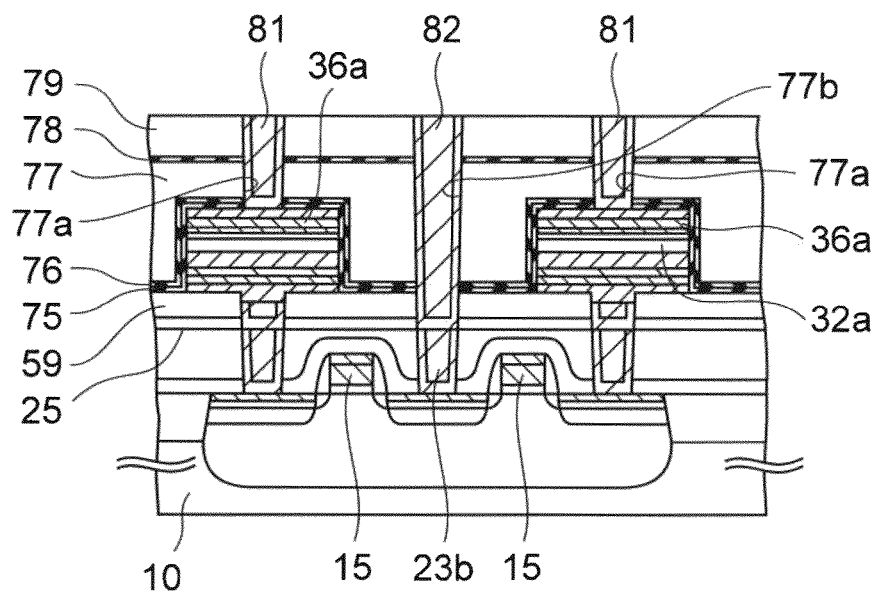
Figure 20R:
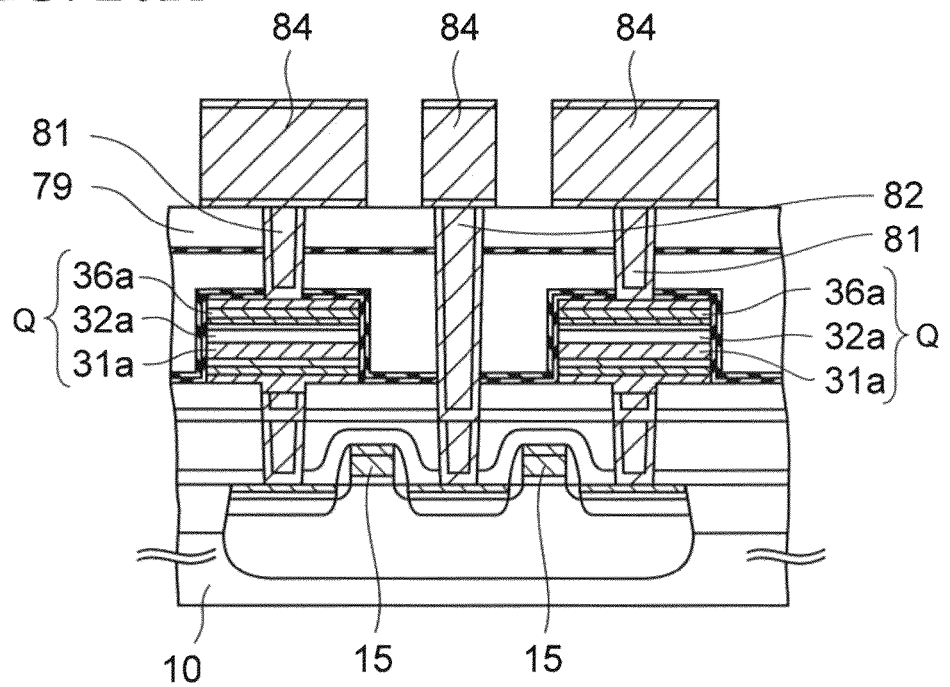

FIGS. 20A to 20R illustrate in sectional views a semiconductor device according to the third embodiment in the course of manufacturing. Note that components in FIGS. 20A to 20R which are the same as those described in the first and second embodiments are assigned the same reference numerals as in these embodiments, and descriptions thereof are omitted in the following description.

The semiconductor device is manufactured in the following manner.

Firstly, as illustrated in FIG. 20A, a MOS transistor TR and first to third contact plugs 23a to 23c are formed according to the process of the first embodiment illustrated in FIG. 2A.

Next, as illustrate din FIG. 20B, an oxidation prevention insulating film 25 is formed with approximately 130 nm thickness on the first to third contact plugs 23a to 23c and on a first interlayer insulating film 22, to protect the first to third contact plugs 23a to 23c from an oxidative atmosphere. The oxidation prevention insulating film 25 is a silicon oxynitride film formed by plasma CVD, for example.

Further, a silicon oxide film is formed with approximately 300 nm thickness to serve as an insulative adhesion film 59, on the oxidation prevention insulating film 25 by plasma CVD using TEOS gas.

Thereafter, each of the oxidation prevention insulating film 25 and the insulative adhesion film 59 is patterned to form a first hole 59a above each of the first contact plug 23a and the third contact plug 23c.

Next, as illustrated in FIG. 20C, a first conductive plug 60 is formed in each of the first holes 59a.

The method for forming the first conductive plug 60 is not particularly limited.

In the third embodiment, a glue film and a tungsten film are formed in this order on a top surface of the insulative adhesion film 59 and insides of the first holes 59a. Then, the glue film and the tungsten film are polished by CMP, so that these films are left in the first holes 59a as first conductive plugs 60. As the glue film, a titanium film of approximately 30 nm thickness and a titanium nitride film of approximately 20 nm thickness are formed in this order by sputtering.

Moreover, in this CMP, over polishing is carried out by using a certain slurry so that no polishing residue is left on the insulative adhesion film 59. Specifically, the certain slurry makes the polishing speed of the glue film and tungsten film being polishing targets faster than the polishing speed of the insulative adhesion film 59 being the foundation.

As a result, the height of a top surface of the first conductive plug 60 becomes lower than that of the insulative adhesion film 59, and a recess of about 20 nm to 50 nm depth is formed in the insulative adhesion film 59 surrounding the first conductive plug 60.

In addition, the first conductive plug 60 is connected to one of the first contact plug 23a and the third contact plug 23c.

Next, as illustrated in FIG. 20D, a titanium film is formed with 100 nm to 300 nm thickness to serve as an underlying conductive layer 61 on each of the insulative adhesion film 59 and the first conductive plugs 60 by sputtering, to fill the aforementioned recess surrounding the first conductive plugs 60 with the underlying conductive film 61.

Then, the underlying conductive film 61 is annealed in a nitrogen atmosphere to nitride the titanium in the underlying conductive film 61. The thus obtained titanium nitride has a (111) orientation appropriate for aligning the later mentioned PZT in the (111) direction. Conditions for this annealing are a treatment time of 60 seconds and a substrate temperature of 650° C., for example.

Next, as illustrated in FIG. 20E, a top surface of the underlying conductive film 61 is polished and made flat by CMP. By thus making the top surface of the underlying conductive film 61 flat, the crystallizability of a ferroelectric film to be later formed on the underlying conductive film 61 may be enhanced.

Note that the thickness of the underlying conductive film 61 after polishing is 50 nm to 100 nm, such as 50 nm.

Additionally, after the polishing, $NH_3$ plasma processing may be performed on the underlying conductive film 61 to cancel a strain in the crystal of the underlying conductive film 61 caused by polishing, to thereby prevent deterioration in the crystallizability of a bottom electrode to be later formed on the underlying conductive film 61.

Next, as illustrated in FIG. 20F, a titanium film is formed with 20 nm thickness to serve as a crystalline conductive film 62, on the underlying conductive film 61 by sputtering. Further, RTA is performed on the crystalline conductive film 62 in a nitrogen atmosphere at a substrate temperature of 650° C. and a treatment time of 60 seconds, to nitride the crystal conductive film 62.

Thus, the crystalline conductive film 62 including titanium nitride oriented in the (111) direction is obtained.

The crystalline conductive film 62 also has a function of an adhesion film, in addition to the function of enhancing the orientation of a film formed thereon by effects of its own orientation.

Further, a titanium aluminum nitride (TiAlN) film is formed with approximately 100 nm thickness to serve as a conductive oxygen barrier film 63, on the crystalline conductive film 62 by sputtering.

Next, as illustrated in FIG. 20G, a conductive film 31, a first ferroelectric film 32, a second ferroelectric film 33, a first conductive metal oxide film 35, and a second conductive metal oxide film 36 are formed in this order on the conductive oxygen barrier film 63.

Such a structure may be manufactured by performing the processes of the first embodiment illustrated in FIGS. 2C to 2H. In this case, as described in the first embodiment, strontium and ruthenium thermally diffuse into the second ferroelectric film 33 from the transition metal oxide material film 34 (see FIG. 2G), and an appropriate amount of iridium thermally diffuses into the second ferroelectric film 33 from the first conductive metal oxide film 35.

Otherwise, the cross section structure illustrated in FIG. 20G may be obtained by performing the processes of the second embodiment illustrated in FIGS. 19A to 19D. In this case, iridium and ruthenium are contained in the second ferroelectric film 33 at the time of forming the film.

Thereafter, PZT attached to a back surface of the semiconductor substrate 10 is cleaned and removed, the PZT being attached at the time of forming the first ferroelectric film 32 or the second ferroelectric film 33.

Next, as illustrated in FIG. 20H, an iridium film is formed with approximately 50 nm thickness to serve as a conductive hydrogen barrier film 70, on the second conductive metal oxide film 36 by sputtering.

Further, a titanium nitride film is formed to serve as a hard mask film 71, on the conductive hydrogen barrier film 70 by sputtering.

The first hard mask 71 is not limited to the titanium nitride film. As the first hard mask 71, a titanium aluminum nitride film, a tantalum aluminum nitride film, or a tantalum nitride film may be formed as a single film, or otherwise a laminate of these films may be formed.

Then, a silicon oxide film is formed as a second hard mask 72 on the first hard mask 71 by plasma CVD using TEOS gas.

Thereafter, as illustrated in FIG. 20I, the first hard mask 71 and the second hard mask 72 are patterned, so that the masks form an island shape in plan view.

Next, as illustrated in FIG. 20J, dry etching is performed from the conductive hydrogen barrier film 70 to the conductive film 31, by plasma etching using a mixed gas including HBr, $O_2$, Ar, and $C_4F_8$ as an etching gas.

With this process, a bottom electrode 31a is made from the conductive film 31, and a capacitor dielectric film 32a is made from the first ferroelectric film 32 and the second ferroelectric film 33. Then, a top electrode 36a is made from the first conductive metal oxide film 35, the second conductive metal oxide film 36, and the conductive hydrogen barrier film 70.

With these processes, a ferroelectric capacitor Q including the bottom electrode 31a, the capacitor dielectric film 32a, and the top electrode 36a is formed in a cell region of the silicon substrate 10.

Next, a description is given of processes for obtaining the cross section structure illustrated in FIG. 20K.

Firstly, the second hard mask 72 is removed by dry etching or wet etching.

Then, portions of the underlying conductive film 61, the crystalline conductive film 62, and the conductive oxygen barrier film 63 not covered by the capacitor Q are removed, by dry etching using a mixed gas including $CF_4$ gas and $O_2$ gas as an etching gas.

Note that the first hard mask 71 left on the capacitor Q is also removed by this dry etching.

Next, as illustrated in FIG. 20L, an amorphous alumina film is formed with a thickness of 10 nm to 30 nm, such as 20 nm, to serve as a first protective insulating film 75 on each of the capacitors Q and the insulative adhesion film 59 by RF magnetron sputtering.

Next, as illustrated in FIG. 20M, recovery annealing is performed on the capacitor dielectric film 32a in an oxygen-containing atmosphere, so that the capacitor dielectric film 32a may recover from the damage caused at the time of forming the first protective insulating film 75.

Conditions for the recovery annealing are a substrate temperature of 500° C. to 700° C., and an annealing time of 30 to 120 minutes, for example.

Next, as illustrated in FIG. 20N, an alumina film is formed with 10 nm to 100 nm thickness to serve as a second protective insulating film 76, on the first protective insulating film 75 by Atomic Layer Deposition (ALD).

The second protective insulating film 76 formed by ALD has a good coverage. Hence, it may be possible to form the second protective insulating film 76 with sufficient thickness at lateral portions of the capacitor Q, to compensate for the thickness of the first protective insulating film 75 which tends to get thin at lateral portions of the capacitor Q.

In the third embodiment, the second protective insulating film 76 is formed by using trimethyl aluminum (TMA) gas as a film-forming gas, the substrate temperature is set to 200° C. to 350° C., and gas pressure is set to 40 Pa.

The second protective insulating film 76 thus formed acts together with the underlying first protective insulating film 75 to protect the capacitor dielectric film 32a from reducing substances such as hydrogen.

Next, as illustrated in FIG. 20O, the second protective insulating film 76 is annealed in an oxygen-containing atmosphere.

This annealing compensates for an oxygen deficiency in the alumina film formed as the second protective insulating film 76. As a result, the composition of the alumina film approaches $Al_2O_3$ which is the stoichiometric composition. Accordingly, the second protective insulating film 76 becomes dense, and instability of the alumina film due to the oxygen deficiency is resolved.

While the annealing conditions are not particularly limited, the annealing is performed in a mixed atmosphere including oxygen and ozone in the third embodiment. Moreover, a total flow amount of oxygen and ozone is set to 10 slm, and the ozone density is 200 g/Nm³. Additionally, the rate of temperature rise is about 10° C. per minute, and the substrate temperature is 400° C. to 700° C.

Next, a description is given of processes for obtaining the cross section structure illustrated in FIG. 20P.

Firstly, a silicon oxide film is formed with approximately 1500 nm thickness to serve as a second interlayer insulating film 77, on the second protection insulating film 76 by plasma CVD. In this plasma CVD, a mixed gas including TEOS gas, oxygen gas, and helium gas is used as the film-forming gas, for example.

Thereafter, a top surface of the second interlayer insulating film 77 is polished and made flat by CMP.

Then, the second interlayer insulating film 77 is annealed in $N_2O$ plasma or $N_2$ plasma atmosphere for dehydration thereof, and for nitriding a top surface thereof to prevent reattachment of moist.

Next, an alumina film is formed with approximately 20 nm to 100 nm thickness to serve as a third protective insulating film 78, on the second interlayer insulating film 77 by sputtering or MOCVD, to protect the capacitor dielectric film 32a from reducing substances such as hydrogen.

Further, a silicon oxide film is formed with approximately 800 nm to 1000 nm thickness to serve as a cap insulating film 79, on the third protective insulating film 78 by plasma CVD using TEOS gas.

Note that a silicon oxynitride film or a silicon nitride film may be formed as the cap insulating film 79, instead of the silicon oxide film.

Next, a description is given of processes for obtaining the cross section structure illustrated in FIG. 20Q.

Firstly, a portion from the cap insulating film 79 to the first protective insulating film 75 is patterned to form a second hole 77a above the top electrode 36a. Then, recovery annealing is performed in an oxygen-containing atmosphere at a substrate temperature of approximately 450° C., so that the capacitor dielectric film 32a may recover from the damage caused by the above processes.

Next, a portion from the cap insulating film 79 to the oxidation prevention insulating film 25 is patterned to form a third hole 77b, and then the second interlayer insulating film 77 and the like are dehydrated by annealing Thereafter, a titanium nitride film and a tungsten film are formed in this order in each of the second holes 77a and the third hole 77b, to form second conductive plugs 81 and a third conductive plug 82.

Note that native oxides on top surfaces of the top electrodes 36a and the second contact plug 23b exposed from the second holes 77a and the third hole 77b may be removed by RF etching using argon plasma, before forming the second conductive plug 81 and the third conductive plug 82. Hence, it may be possible to prevent a contact failure from occurring in the second conductive plug 81 and the third conductive plug 82 due to native oxides.

Next, as illustrated in FIG. 20R, a metal stacked film is formed by sputtering on each of the second conductive plugs 81, the third conductive plug 82, and the cap insulating film 79, and then the metal stacked film is patterned to form a metal wiring 84.

As the metal stacked film, a titanium nitride film of approximately 50 nm thickness, a copper-containing aluminum film of approximately 550 nm thickness, a titanium film of approximately 5 nm thickness, and a titanium nitride film of approximately 50 nm thickness are formed in this order, for example.

Thus, the basic structure of the semiconductor device according to the third embodiment is completed.

In the third embodiment described above, the process illustrated in FIG. 20G is performed according to the first embodiment or the second embodiment. For this reason, it may be possible to prevent paraelectric layers from being formed in the capacitor dielectric film 32a, the paraelectric layers being formed because of iridium diffused from the first conductive metal oxide film 35. Hence, the amount of charge reversal and the imprint characteristic of the ferroelectric capacitor Q (see FIG. 20R) may be improved.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of manufacturing a semiconductor device, the method comprising:
    forming an insulating film over a semiconductor substrate;
    forming a conductive film over the insulating film;
    forming a first ferroelectric film over the conductive film;
    forming an amorphous second ferroelectric film over the first ferroelectric film;
    forming a transition metal oxide material film containing ruthenium over the second ferroelectric film;
    forming a first conductive metal oxide film over the transition metal oxide material film without exposing the transition metal oxide material film to an air;
    annealing and crystallizing the second ferroelectric film after forming the first conductive metal oxide film;
    patterning the first conductive metal oxide film to form a top electrode of a ferroelectric capacitor;
    patterning the first ferroelectric film and the second ferroelectric film to form a capacitor dielectric film of the ferroelectric capacitor; and
    patterning the conductive film to form a bottom electrode of the ferroelectric capacitor.

2. The method of manufacturing a semiconductor device according to claim 1, wherein a material of the transition metal oxide material film is a transition metal oxide having an $ABO_3$ type perovskite structure when crystallized.

3. The method of manufacturing a semiconductor device according to claim 2, wherein the material of the transition metal oxide material film is any one selected from the group consisting of $SrRuO_3$, $CaRuO_3$, $BaRuO_3$, $La_4Ru_2O_{10}$, $LaSrCoRuO_3$, $LaSrRuO_3$, and $LaSrMnRuO_3$.

4. The method of manufacturing a semiconductor device according to claim 1, wherein in the forming the transition metal oxide material film, the transition metal oxide material film is formed by sputtering and is in an amorphous state upon completion of the film formation.

5. The method of manufacturing a semiconductor device according to claim 4, wherein in the forming the transition metal oxide material film, a substrate temperature is set to equal to or higher than 20° C. and equal to or lower than 350° C.

6. The method of manufacturing a semiconductor device according to claim 4, wherein the forming the transition metal oxide material film uses a sputter target to which a bismuth oxide is added.

7. The method of manufacturing a semiconductor device according to claim 4, wherein in the forming the transition metal oxide material film, the sputtering is carried out by using a sputter gas from which oxygen is removed.

8. The method of manufacturing a semiconductor device according to claim 1, wherein in the forming the transition metal oxide material film, the transition metal oxide material film is formed in a thickness equal to or larger than 0.5 nm and equal to or smaller than 3.0 nm.

9. The method of manufacturing a semiconductor device according to claim 1, wherein the annealing and crystallizing the second ferroelectric film is carried out in an oxygen-containing atmosphere.

10. The method of manufacturing a semiconductor device according to claim 9, wherein a flow rate of oxygen gas in the oxygen-containing atmosphere is equal to or more than 1% and equal to or less than 10%.

11. The method of manufacturing a semiconductor device according to claim 1, wherein in the forming the first conductive metal oxide film, the substrate temperature is set to equal to or higher than 150° C. and equal to or lower than 350° C.

12. The method of manufacturing a semiconductor device according to claim 1, the method further comprising:
    forming a second conductive metal oxide film over the first conductive metal oxide film, the second conductive metal oxide film having a larger composition ratio of oxygen than the first conductive metal oxide film.

13. The method of manufacturing a semiconductor device according to claim 12, wherein the first conductive metal oxide film and the second conductive metal oxide film are each made of an iridium oxide.

14. The method of manufacturing a semiconductor device according to claim 1, wherein a material of each of the first ferroelectric film and the second ferroelectric film is an $ABO_3$ type ferroelectric oxide when crystallized.

* * * * *